United States Patent
Seshita et al.

(10) Patent No.: US 10,931,246 B2
(45) Date of Patent: Feb. 23, 2021

(54) HIGH-FREQUENCY AMPLIFIER CIRCUITRY AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toshiki Seshita, Kawasaki Kanagawa (JP); Yasuhiko Kuriyama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 10 days.

(21) Appl. No.: 16/291,212

(22) Filed: Mar. 4, 2019

(65) Prior Publication Data

US 2020/0007095 A1    Jan. 2, 2020

(30) Foreign Application Priority Data

Jun. 29, 2018    (JP) .............................. JP2018-124621

(51) Int. Cl.
  *H03F 3/193*    (2006.01)
  *H03F 1/32*    (2006.01)
  *H03F 3/24*    (2006.01)

(52) U.S. Cl.
  CPC ........... *H03F 3/193* (2013.01); *H03F 1/3205* (2013.01); *H03F 3/245* (2013.01)

(58) Field of Classification Search
  CPC ........ H03F 3/193; H03F 1/3205; H03F 3/245; H03F 2200/451; H03F 1/223; H03F 1/56

USPC ......... 330/277, 296, 136, 285, 51, 283, 284, 330/311, 301

See application file for complete search history.

(56) References Cited

U.S. PATENT DOCUMENTS

| 8,903,343 | B2 | 12/2014 | Holenstein et al. |
| 9,035,697 | B2 | 5/2015 | Youssef et al. |
| 2018/0083665 | A1 | 3/2018 | Sugawara et al. |

FOREIGN PATENT DOCUMENTS

| JP | 2016-504893 A | 2/2016 |
| JP | 2016-514439 A | 5/2016 |
| JP | 2018-50129 A | 3/2018 |

*Primary Examiner* — Khanh V Nguyen
*Assistant Examiner* — Khiem D Nguyen
(74) *Attorney, Agent, or Firm* — White & Case LLP

(57) ABSTRACT

High-frequency amplifier circuitry has a common-source first transistor to amplify a high-frequency input signal, a common-gate second transistor to amplify a signal amplified by the first transistor to generate an output signal, a first inductor connected between a source of the first transistor and a first reference potential node, a second inductor connected between a drain of the second transistor and a second reference potential, a first switch to select whether to connect a first attenuator on an input signal path, a second switch to select whether to connect a first resistor between the input signal path and the first reference potential node, a third switch to select at least one of second resistors connected in parallel to the second inductor, and a fourth switch to select at least one of first capacitors connected in parallel on an output signal path connected to the drain of the second transistor.

20 Claims, 47 Drawing Sheets

| Gain mode | VB1(V) | VB2(V) | G1 (V) | G1R (V) | G23 (V) | G23R (V) | G3 (V) | xG3 (V) |
|---|---|---|---|---|---|---|---|---|
| G0 | VB1_G0 | VB2_G0 | -2 | 0 | -2 | 0 | -2 | 3 |
| G1 | VB1_G1 | VB2_G1 | 3 | 3 | -2 | 0 | -2 | 3 |
| G2 | VB1_G2 | VB2_G2 | -2 | 0 | 3 | 3 | -2 | 3 |
| G3 | VB1_G3 | VB2_G3 | -2 | 0 | 3 | 3 | 3 | -2 |

S-PARAMETER AND NOISE FIGURE IN GO-MODE

S-PARAMETER AND NOISE FIGURE IN G1-MODE

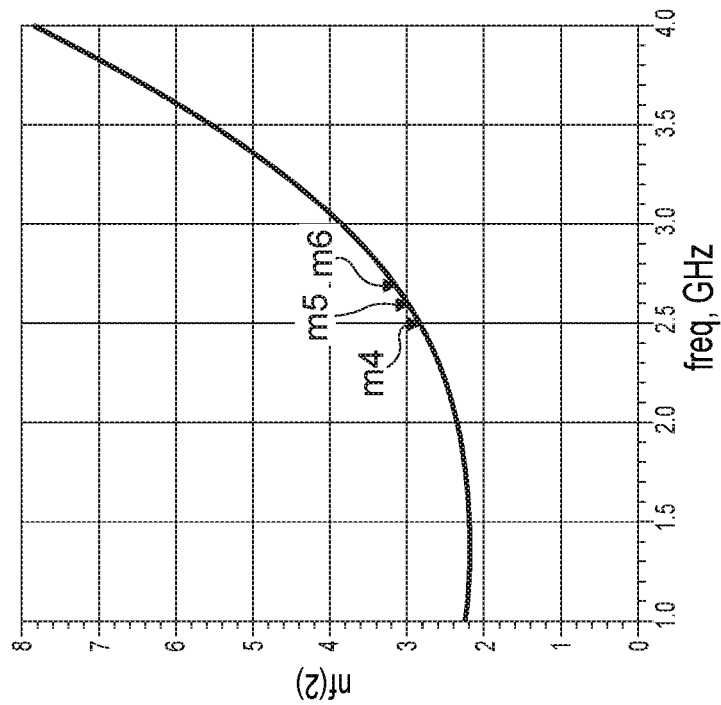
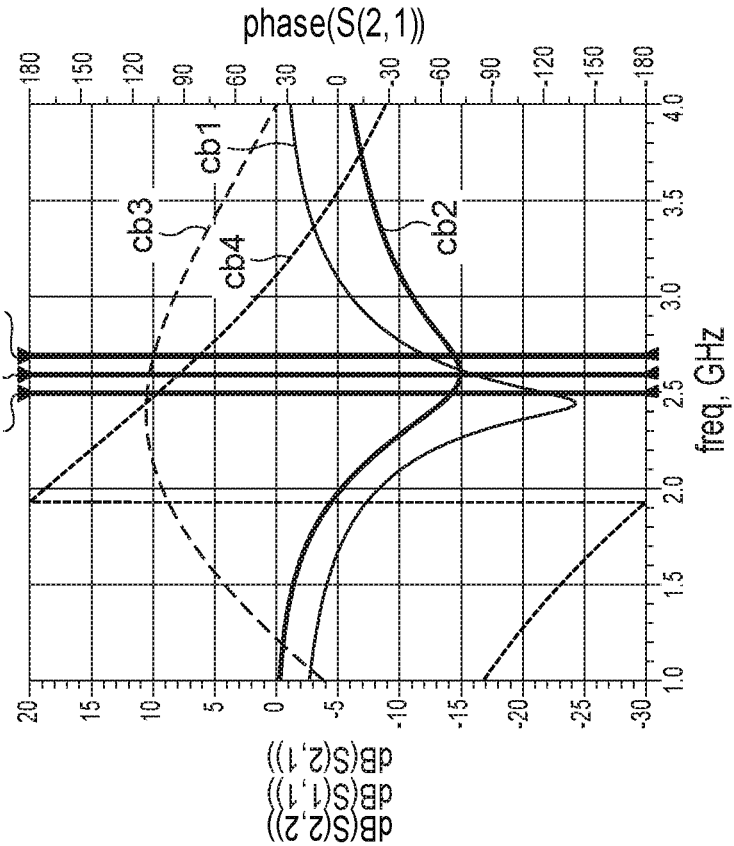
FIG. 6A
FIG. 6B
S-PARAMETER AND NOISE FIGURE IN G2-MODE

S-PARAMETER AND NOISE FIGURE IN G3-MODE

| MODE | Idd_Ina (mA) | S21(dB) fcenter | NF(dB) fcenter | S11(dB) WITHIN BAND | S22(dB) WITHIN BAND | IIP3(dBm) fcenter | S21-PHASE (deg) | |
|---|---|---|---|---|---|---|---|---|
| | | | | | | | 2.496GHz | 2.69GHz |
| G0 | 5.80 | 18.28 | 0.76 | −14.11 | −14.07 | 0.3 | 116.0 | 83.6 |
| G1 | 5.80 | 15.22 | 0.81 | −15.54 | −15.41 | 2.3 | 107.5 | 80.5 |
| G2 | 3.93 | 10.29 | 2.98 | −12.23 | −14.22 | 6.8 | 105.5 | 81.3 |
| G3 | 3.02 | −1.85 | 10.90 | −21.21 | −16.69 | 15.3 | 115.0 | 91.1 |

| INTER-GAIN MODE MAXIMUM PHASE DISCONTINUITY (deg) |
|---|
| 10.57 |

※ IIP3 IS A VALUE AT Pin=−50dBm

FIG. 9

| Gain-mode | VB1(V) | VB2(V) | G1 (V) | G1R (V) | G01 (V) | G23 (V) | G23R (V) | G2 (V) | G3 (V) | xG3 (V) |
|---|---|---|---|---|---|---|---|---|---|---|
| G0 | VB1_G0 | VB2_G0 | -2 | 0 | 3 | -2 | 0 | -2 | -2 | 3 |
| G1 | VB1_G1 | VB2_G1 | 3 | 3 | 3 | -2 | 0 | -2 | -2 | 3 |
| G2 | VB1_G2 | VB2_G2 | -2 | 0 | -2 | 3 | 3 | 3 | -2 | 3 |
| G3 | VB1_G3 | VB2_G3 | -2 | 0 | -2 | 3 | 3 | -2 | 3 | -2 |

S-PARAMETER AND NOISE FIGURE IN G0-MODE

S-PARAMETER AND NOISE FIGURE IN G1-MODE

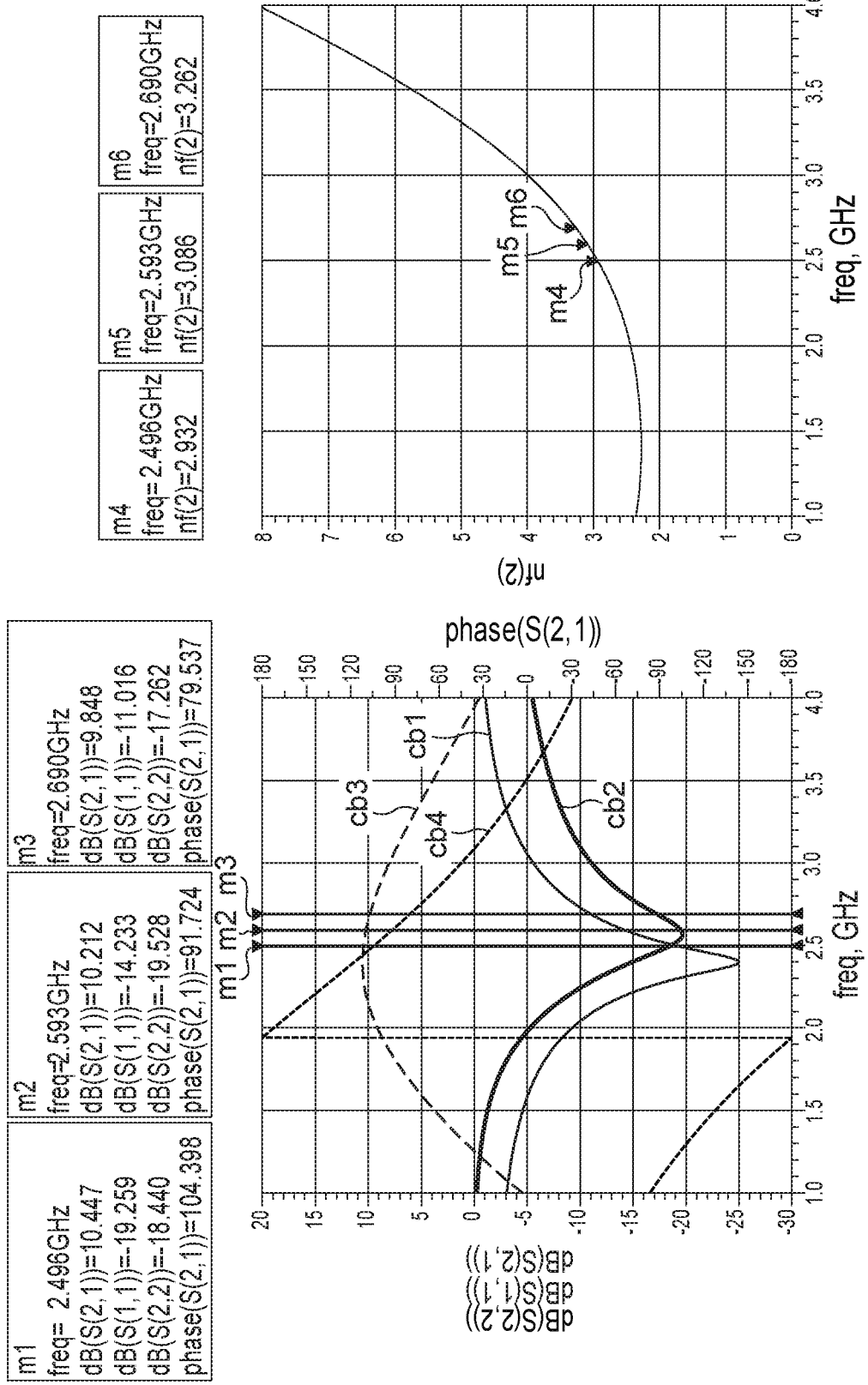

S-PARAMETER AND NOISE FIGURE IN G3-MODE

| MODE | Idd_lna (mA) | S21(dB) fcenter | NF(dB) fcenter | S11(dB) WITHIN BAND | S22(dB) WITHIN BAND | IIP3(dBm) fcenter | S21-PHASE (deg) | |
|---|---|---|---|---|---|---|---|---|
| | | | | | | | 2.496GHz | 2.69GHz |
| G0 | 5.98 | 18.22 | 0.78 | -13.50 | -13.28 | 6.0 | 114.2 | 81.5 |
| G1 | 5.98 | 15.17 | 0.84 | -15.54 | -15.37 | 8.5 | 109.0 | 81.1 |
| G2 | 3.71 | 10.21 | 3.09 | -11.02 | -17.26 | 7.7 | 104.4 | 79.5 |
| G3 | 3.20 | -1.72 | 10.81 | -19.91 | -18.50 | 20.3 | 104.8 | 79.7 |

| INTER-GAIN MODE MAXIMUM PHASE E DISCONTINUITY (deg) |
|---|
| 9.76 |

FIG.17

| Gain-mode | VB1(V) | VB2(V) | G1 (V) | G1R (V) | G2 (V) | G23 (V) | G23R (V) | G3 (V) | xG3 (V) |
|---|---|---|---|---|---|---|---|---|---|
| G0 | VB1_G0 | VB2_G0 | -2 | 0 | -2 | -2 | 0 | -2 | 3 |
| G1 | VB1_G1 | VB2_G1 | 3 | 3 | -2 | -2 | 0 | -2 | 3 |
| G2 | VB1_G2 | VB2_G2 | -2 | 0 | 3 | 3 | 3 | -2 | 3 |
| G3 | VB1_G3 | VB2_G3 | -2 | 0 | -2 | 3 | 3 | 3 | -2 |

S-PARAMETER AND NOISE FIGURE IN G0-MODE

S-PARAMETER AND NOISE FIGURE IN G1-MODE

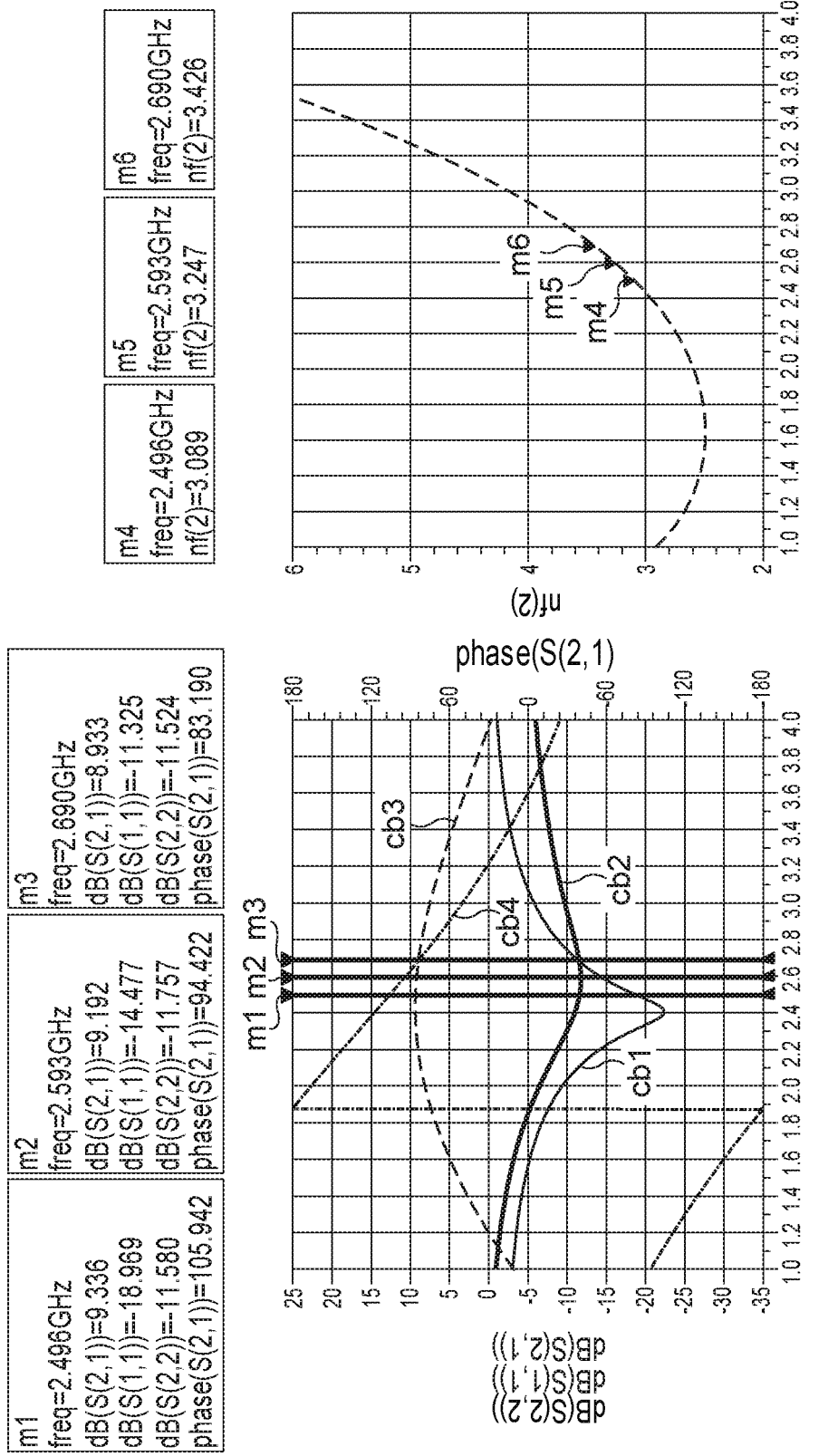

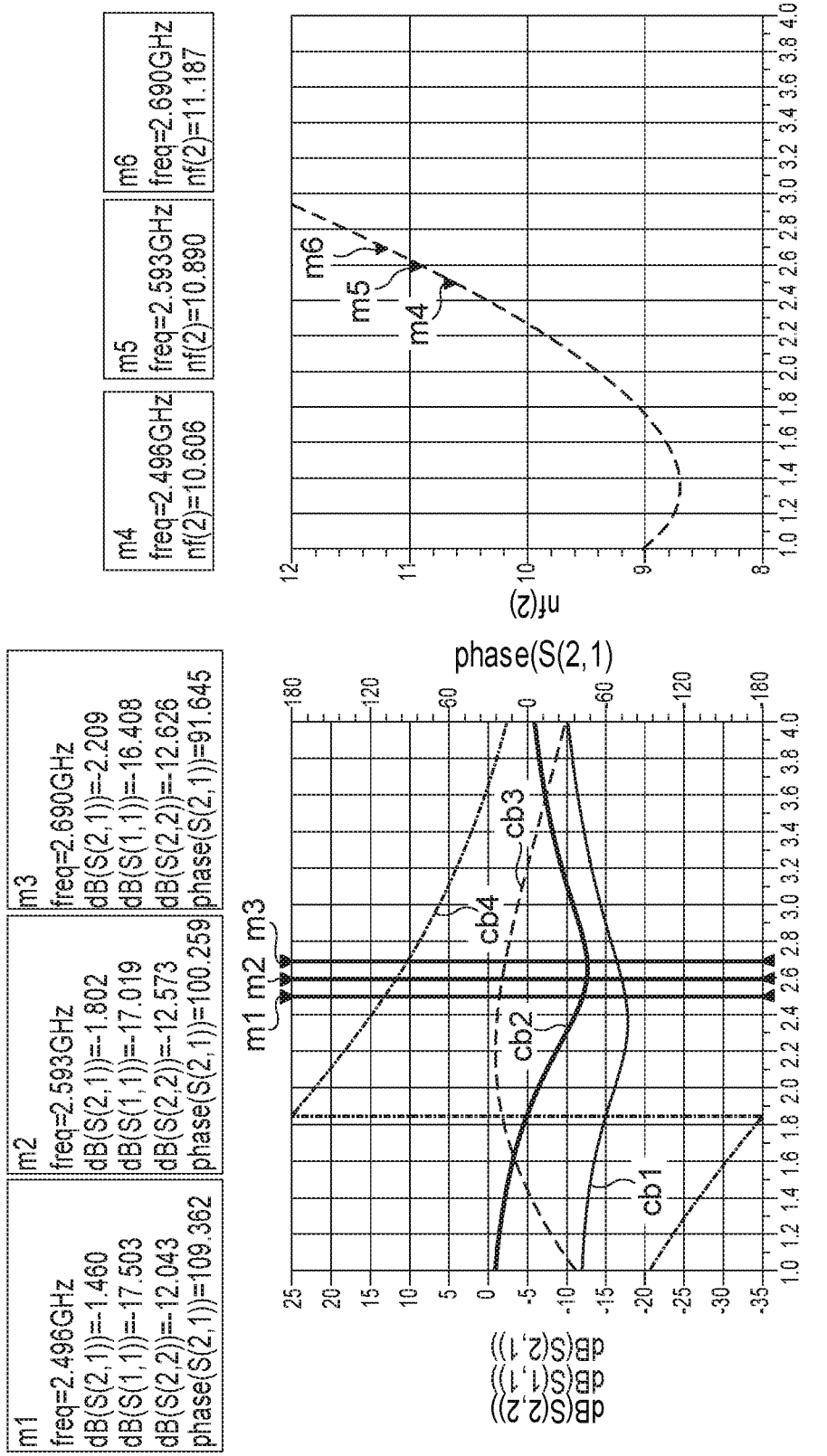

| GAIN MODE | Idd_Ina (mA) | S21(dB) fcenter | NF(dB) fcenter | S11(dB) WITHIN BAND | S22(dB) WITHIN BAND | IIP3(dBm) fcenter | S21-PHASE (deg) | |
|---|---|---|---|---|---|---|---|---|
| | | | | | | | 2.496GHz | 2.69GHz |
| G0 | 6.14 | 18.02 | 0.82 | −12.48 | −13.82 | 7.4 | 115.1 | 82.2 |
| G1 | 6.14 | 15.03 | 0.88 | −15.42 | −16.94 | 7.8 | 105.9 | 78.8 |
| G2 | 4.89 | 9.19 | 3.25 | −11.33 | −11.52 | 7.9 | 105.9 | 83.2 |
| G3 | 2.63 | −1.80 | 10.89 | −16.41 | −12.04 | 15.6 | 109.4 | 91.6 |

| INTER-GAIN MODE MAXIMUM PHASE DEVIATION (deg) |
|---|
| 12.8 |

FIG.27

| Gain-mode | VB1(V) | VB2(V) | G1 (V) | G1R (V) | G23 (V) | G23R (V) | G2 (V) | G3 (V) | xG3 (V) |
|---|---|---|---|---|---|---|---|---|---|
| G0 | VB1_G0 | VB2_G0 | -2 | 0 | -2 | 0 | -2 | -2 | 3 |
| G1 | VB1_G1 | VB2_G1 | 3 | 3 | -2 | 0 | -2 | -2 | 3 |
| G2 | VB1_G2 | VB2_G2 | -2 | 0 | 3 | 3 | 3 | -2 | 3 |
| G3 | VB1_G3 | VB2_G3 | -2 | 0 | 3 | 3 | -2 | 3 | -2 |

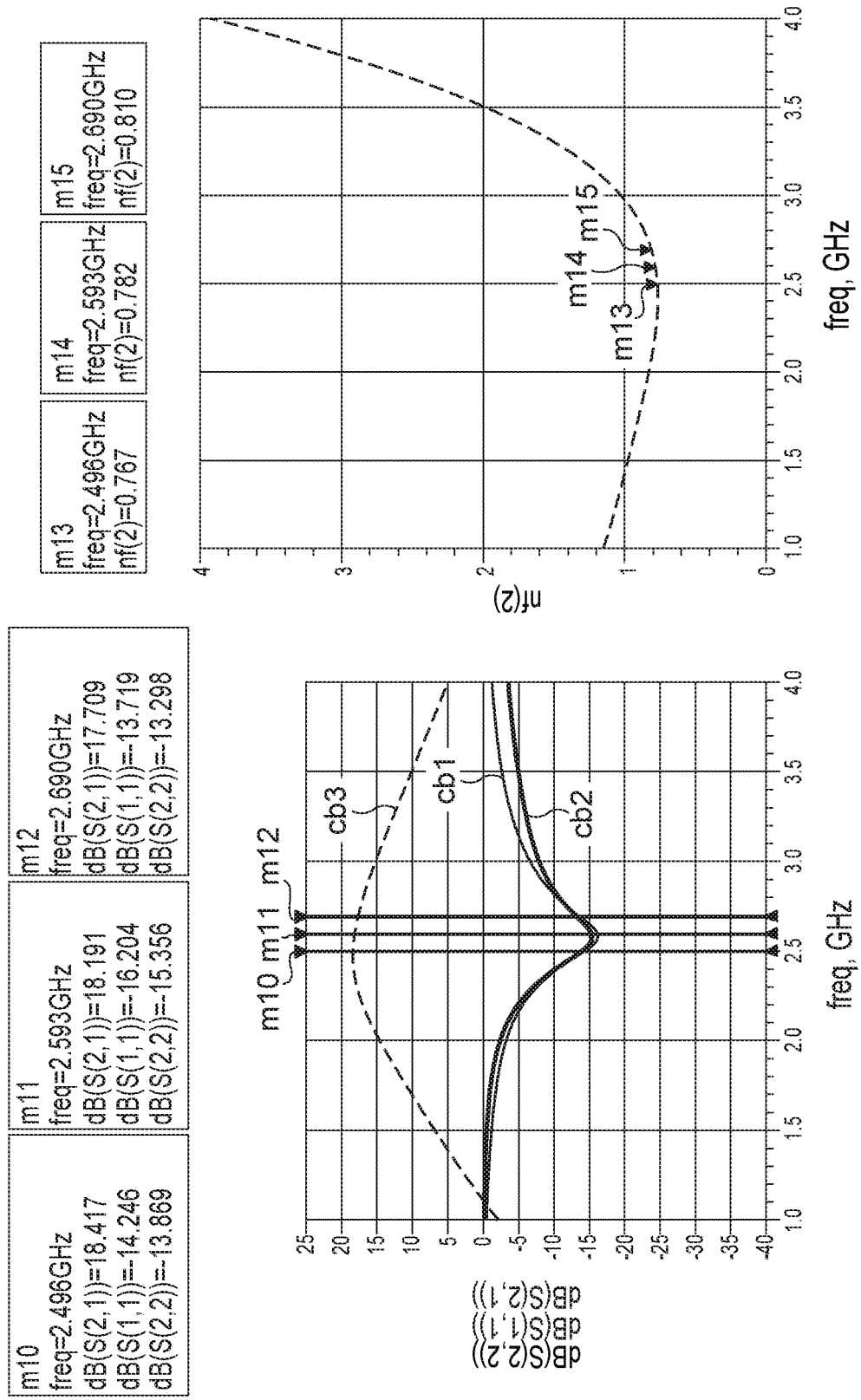

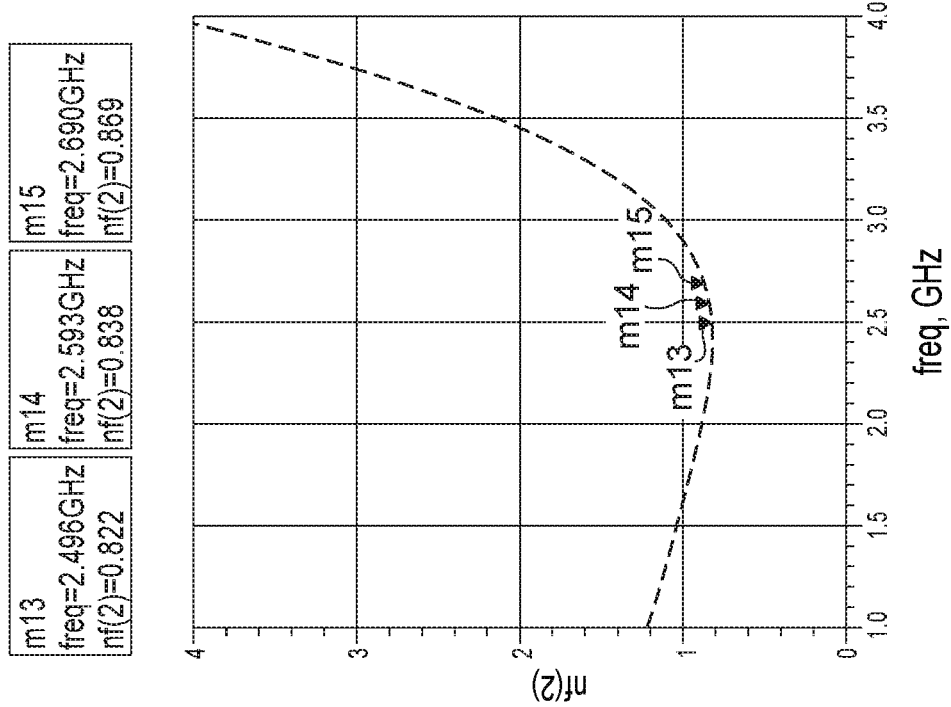
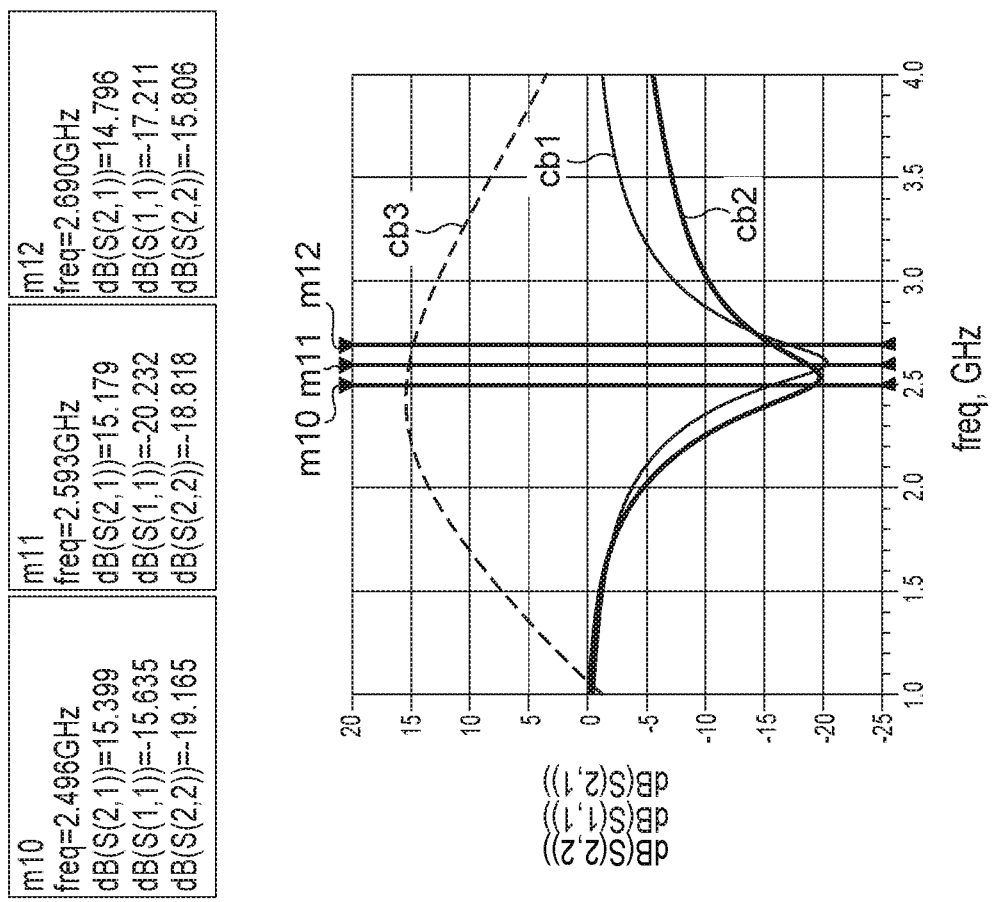
FIG. 33A
FIG. 33B
S-PARAMETER AND NOISE FIGURE IN G1-MODE

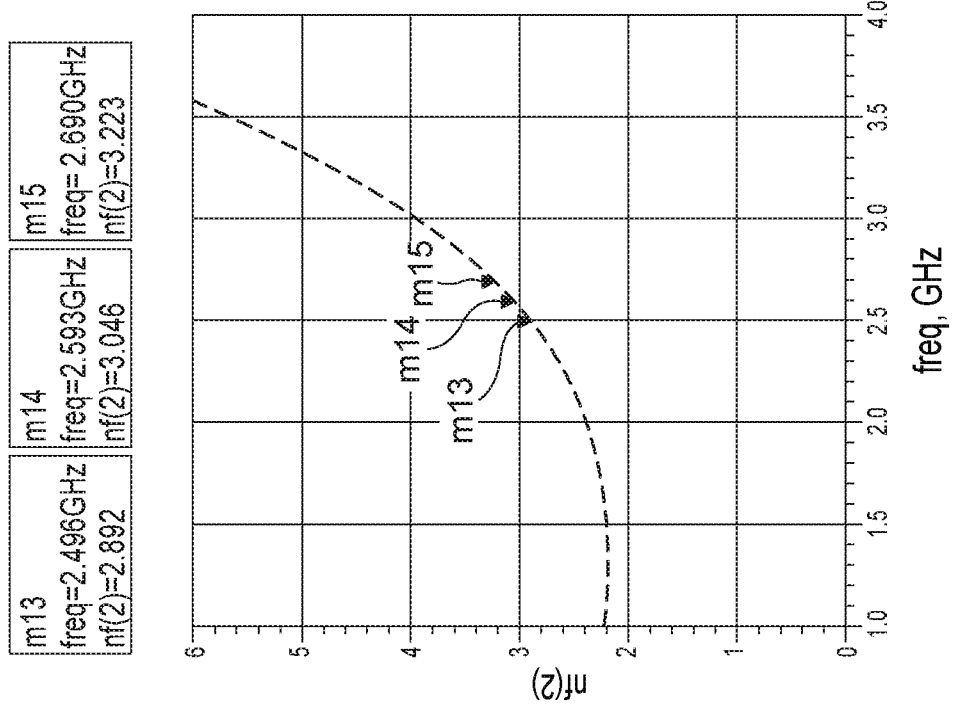
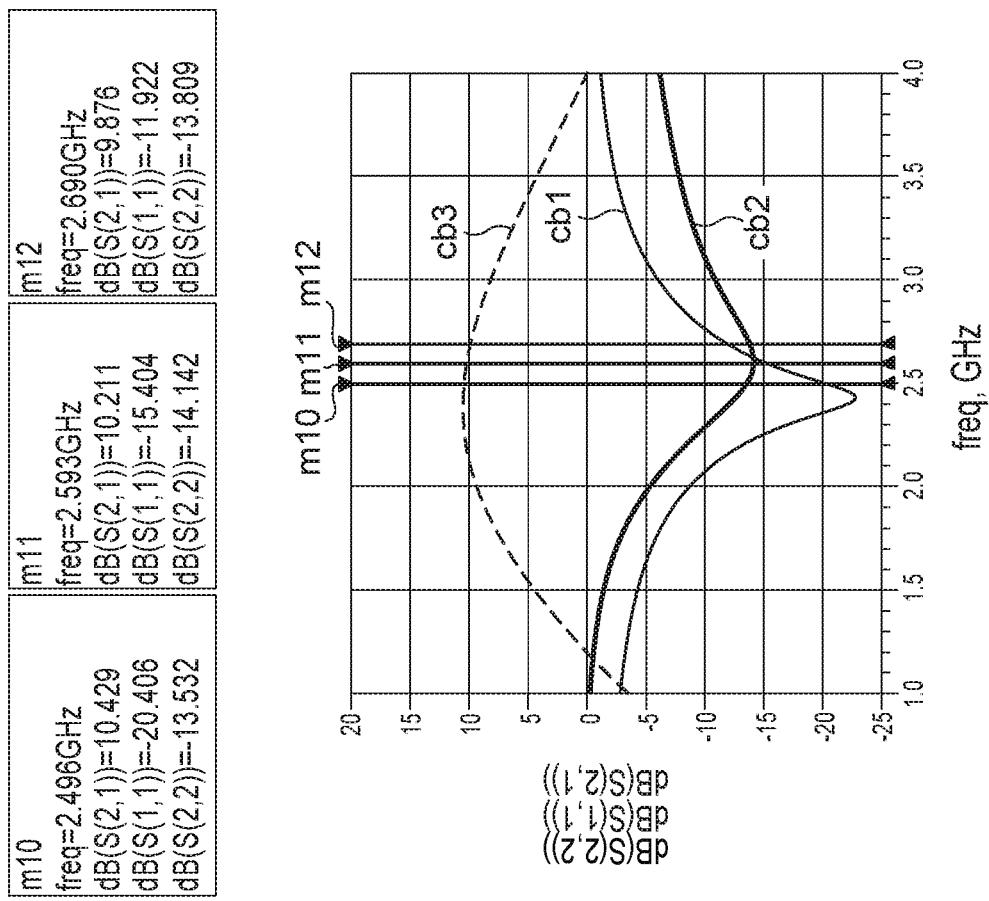
FIG. 34A
FIG. 34B
S-PARAMETER AND NOISE FIGURE IN G2-MODE

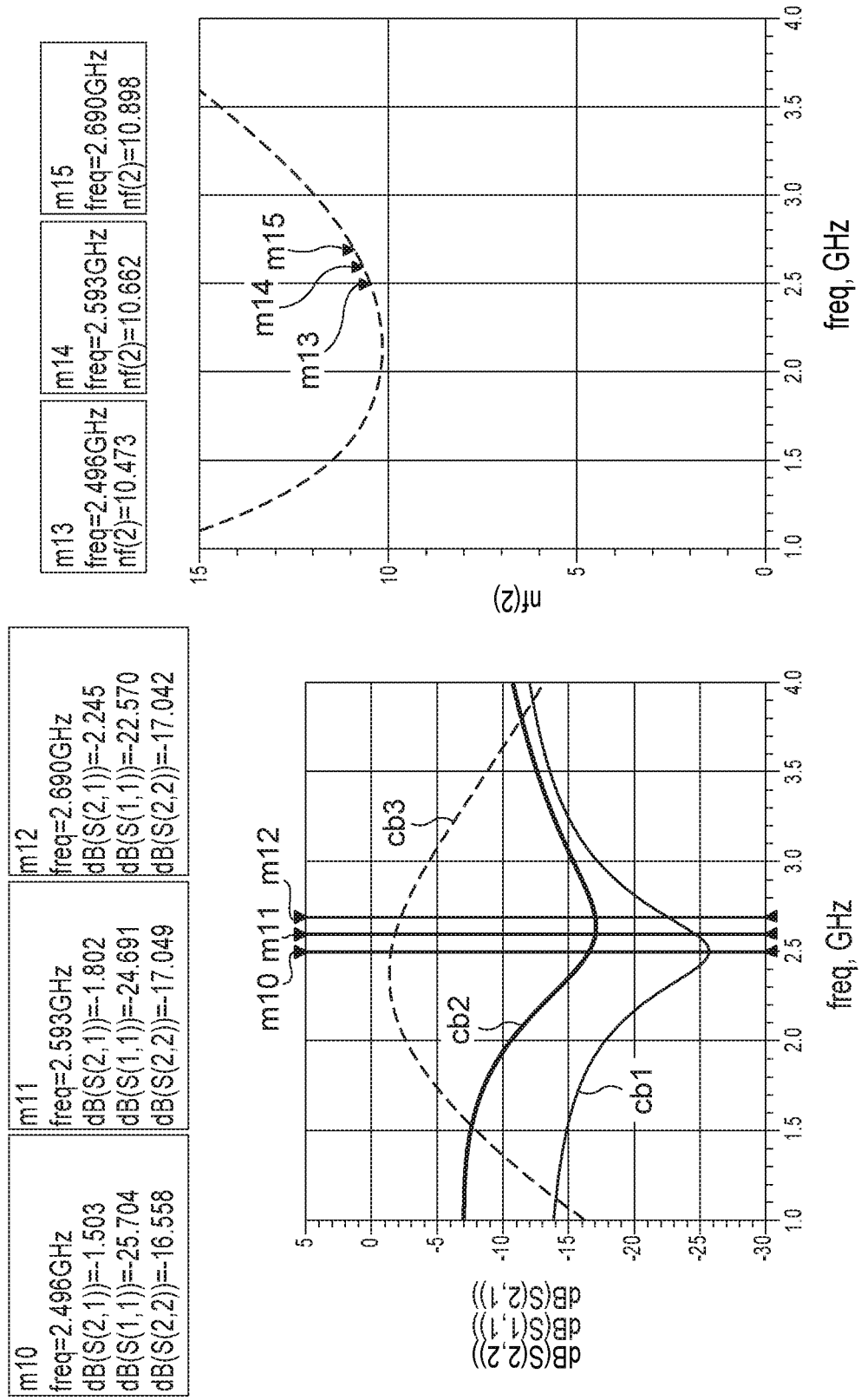

| MODE | Idd_lna (mA) | S21(dB) fcenter | NF(dB) fcenter | IIP3(dBm) fcenter | S21-PHASE (deg) | |
|---|---|---|---|---|---|---|
| | | | | | 2.496GHz | 2.69GHz |
| G0 | 5.976 | 18.191 | 0.782 | 6.166 | 114.3 | 81.7 |
| G1 | 5.976 | 15.179 | 0.838 | 8.177 | 105.9 | 78.6 |
| G2 | 4.598 | 10.211 | 3.046 | 7.614 | 103.9 | 80.1 |
| G3 | 3.202 | -1.802 | 10.662 | 15.728 | 107.8 | 83.1 |

| INTER-GAIN MODE MAXIMUM PHASE E DISCONTINUITY (deg) |
|---|
| 10.44 |

FIG.36

| Gain-mode | VB1(V) | VB2(V) | G1 (V) | G1R (V) | G23 (V) | G23R (V) | G2 (V) | G3 (V) | xG3 (V) |
|---|---|---|---|---|---|---|---|---|---|
| G0 | VB1_G0 | VB2_G0 | -2 | 0 | -2 | 0 | -2 | -2 | 3 |
| G1 | VB1_G1 | VB2_G1 | 3 | 3 | -2 | 0 | -2 | -2 | 3 |
| G2 | VB1_G2 | VB2_G2 | -2 | 0 | 3 | 3 | 3 | -2 | 3 |
| G3 | VB1_G3 | VB2_G3 | -2 | 0 | 3 | 3 | -2 | 3 | -2 |

FIG. 42A / FIG. 42B
S-PARAMETER AND NOISE FIGURE IN G1-MODE

| Band41(2496MHz~2690MHz) | | | | | | | | | |
|---|---|---|---|---|---|---|---|---|---|
| MODE | Idd_Ina (mA) | S21(dB) fcenter | NF(dB) fcenter | S11(dB) WITHIN BAND | S22(dB) WITHIN BAND | IIP3(dBm) fcenter | IP1dB(dBm) fcenter | S21-PHASE (deg) 2.496GHz | S21-PHASE (deg) 2.69GHz |
| G0 | 6.16 | 18.24 | 0.768 | -11.31 | -13.12 | 4.7 | -11.9 | 110.3 | 77.7 |
| G1 | 6.16 | 15.21 | 0.825 | -13.77 | -16.16 | 7.4 | -7.8 | 101.8 | 74.4 |
| G2 | 4.60 | 10.26 | 2.769 | -11.08 | -13.42 | 8.1 | -1.8 | 100.5 | 76.4 |
| G3 | 3.20 | -1.80 | 10.463 | -22.64 | -16.23 | 20.7 | 7.5 | 101.4 | 74.6 |
| PHASE E DISCONTINUITY⇒ | | | | | | | | 9.88 | 3.21 |

FIG.45

HIGH-FREQUENCY AMPLIFIER CIRCUITRY AND SEMICONDUCTOR DEVICE

CROSS REFERENCE TO RELATED APPLICATIONS

This application is based upon and claims the benefit of priority from the prior Japanese Patent Application No. 2018-124621, filed on Jun. 29, 2018, the entire contents of which are incorporated herein by reference.

FIELD

Embodiments of the present disclosure relate to a high-frequency amplifier circuit and a semiconductor device.

BACKGROUND

In recent years, it has been considered to replace a fabrication process of a high-frequency low noise amplifier (LNA: Low Noise Amplifier) from an SiGe bipolar process (hereinafter, SiGe process) to an SOI (Silicon On Insulator) CMOS process (hereinafter, SOI process). The SOI process is lower in cost than the SiGe process and parasitic capacitance of an MOS transistor fabricated by the SOI process is small, so that power loss of a high frequency signal becomes small. Therefore, by using the SOI process, it is possible, without degrading electrical characteristics, to form a high frequency switch and a high-frequency low noise amplifier on the same SOI substrate, making one-chip configuration possible.

The LNA is often demanded to have a gain variable function. The specification of a plurality of gain modes may be defined in the wireless communication standards. In more specifically, an allowable range of reflection characteristics S11 and S22, noise figure NF, and IIP3 (Input 3rd-order Intercept Point) may be defined in each gain mode. In a gain mode of a lower gain, it is not easier to make IIP3 fall into the allowable range. Moreover, as transmission phase discontinuity between gain modes, for example 20 degrees may be demanded. However, it is also not easy to satisfy the demand.

BRIEF DESCRIPTION OF THE DRAWINGS

FIG. 3 is a figure showing the voltage values of bias voltages and of gate signals to be input to the gates of first to tenth transistor switches of FIG. 2;

FIG. 6A is a figure showing S-parameters of the LNA of FIG. 2 in a G2-mode;

FIG. 6B is a figure showing noise figure NF of the LNA of FIG. 2 in the G2-mode;

FIG. 9 is a figure showing a result of simulation in the G0- to G3-modes;

FIG. 12 is a figure showing the voltage values of bias voltages and of gate signals to be input to the gates of first to tenth transistor switches in FIG. 11;

FIG. 15A is a figure showing S-parameters of the LNA of FIG. 11 in the G2-mode;

FIG. 15B is a figure showing noise figure NF of the LNA of FIG. 11 in the G2-mode;

FIG. 17 is a figure showing a result of simulation for the LNA of FIG. 11 in the G0- to G3-modes;

FIG. 22 is a figure showing the voltage values of bias voltages and of gate signals to be input to the gates of first to tenth transistor switches of the LNA in FIG. 21;

FIG. 25A is a figure showing S-parameters of the LNA of FIG. 21 in the G2-mode;

FIG. 25B is a figure showing noise figure NF of the LNA of FIG. 21 in the G2-mode;

FIG. 26A is a figure showing S-parameters of the LNA of FIG. 21 in the G3-mode;

FIG. 26B is a figure showing noise figure NF of the LNA of FIG. 21 in the G3-mode;

FIG. 27 is a figure showing a result of simulation for the LNA of FIG. 21 in the G0- to G3-modes;

FIG. 31 is a figure showing the voltage values of bias voltages and of gate signals to be input to the gates of first to tenth transistor switches of the LNA in FIG. 30;

FIG. 32A is a figure showing S-parameters of the LNA of FIG. 30 in the G0-mode;

FIG. 32B is a figure showing noise figure NF of the LNA of FIG. 30 in the G0-mode;

FIG. 33A is a figure showing S-parameters of the LNA of FIG. 30 in the G1-mode;

FIG. 33B is a figure showing noise figure NF of the LNA of FIG. 30 in the G1-mode;

FIG. 34A is a figure showing S-parameters of the LNA of FIG. 30 in the G2-mode;

FIG. 34B is a figure showing noise figure NF of the LNA of FIG. 30 in the G2-mode;

FIG. 35A is a figure showing S-parameters of the LNA of FIG. 30 in the G3-mode;

FIG. 35B is a figure showing noise figure NF of the LNA of FIG. 30 in the G3-mode;

FIG. 36 is a figure showing a result of simulation for the LNA of FIG. 30 in the G0- to G3-modes;

FIG. 40 is a figure showing the voltage values of bias voltages and of gate signals to be input to the gates of first to tenth transistor switches of the LNA in FIG. 39;

FIG. 45 is a figure showing a result of simulation for the LNA of FIG. 39 in the G0- to G3-modes;

DETAILED DESCRIPTION

According to one embodiment, high-frequency amplifier circuitry has a common-source first transistor to amplify a high-frequency input signal, a common-gate second transistor to amplify further a signal amplified by the first transistor to generate an output signal, a first inductor connected between a source of the first transistor and a first reference potential node, a second inductor connected between a drain of the second transistor and a second reference potential, a first switch to select whether to connect a first attenuator on an input signal path from a node receiving the high-frequency input signal to a gate of the first transistor, a second switch to select whether to connect a first resistor between the input signal path and the first reference potential node, a third switch to select at least one of a plurality of second resistors connected in parallel to the second inductor, and a fourth switch to select at least one of a plurality of first capacitors connected in parallel on an output signal path connected to the drain of the second transistor.

Hereinbelow, embodiments will be explained with reference to the accompanying drawings. A part of the explanation in the specification and the accompanying drawings may be omitted, modified or simplified on the purpose of easy understanding and simplicity of the explanation. However, the technical contents to the extent that a similar function can be expected will be interpreted to be included in the embodiments. In the accompanying drawings of the present specification, for simplicity in drawings and easy understanding, the scale, the ratio of height to width, etc. are modified to be exaggerated from those of actual ones.

First Embodiment

Figure 1:
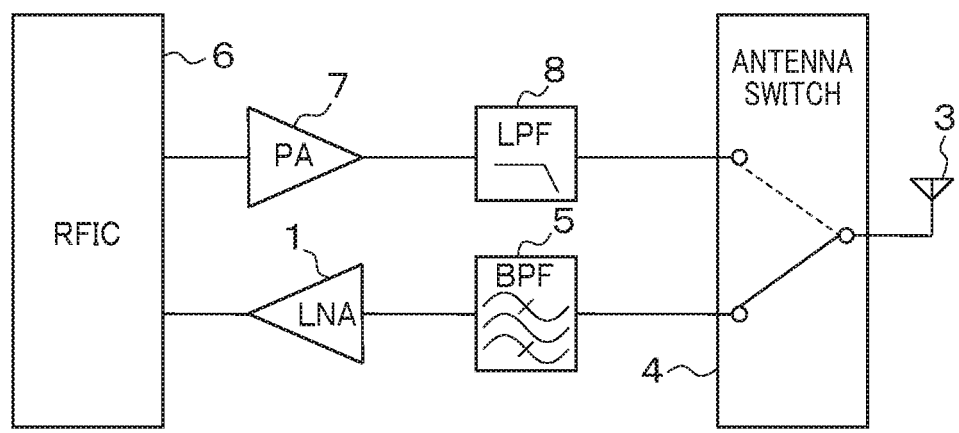
FIG. 1 is a block diagram schematically showing the configuration of a wireless device having an LNA according to a first embodiment built therein.

A high-frequency amplifier circuit (hereinafter, LNA) according to a first embodiment is used in a wireless device 2 such as a mobile phone and a smart phone. FIG. 1 is a block diagram schematically showing the configuration of a wireless device 2 having an LNA 1 according to a first embodiment built therein. The wireless device 2 of FIG. 1 is provided with an antenna 3, an antenna switch 4, a band-pass filter (BPF) 5, the LNA 1, a wireless IC (RFIC) 6, a power amplifier (PA) 7, and a low-pass filter (LPF) 8.

The antenna switch 4 switches between transmission and reception. FIG. 1 shows an example of a transmission side and a reception side each having one circuit system. However, the transmission side and the reception side may have a plurality of circuit systems for transmitting and receiving signals in a plurality of frequency bands, respectively. The antenna switch 4 and the LNA 1 of FIG. 1 can be arranged on the same SOI substrate to be formed into one chip. By arranging the antenna switch 4 and the LNA 1 of FIG. 1 on the SOI substrate, the reduction of power consumption and compactness become possible.

Figure 2:
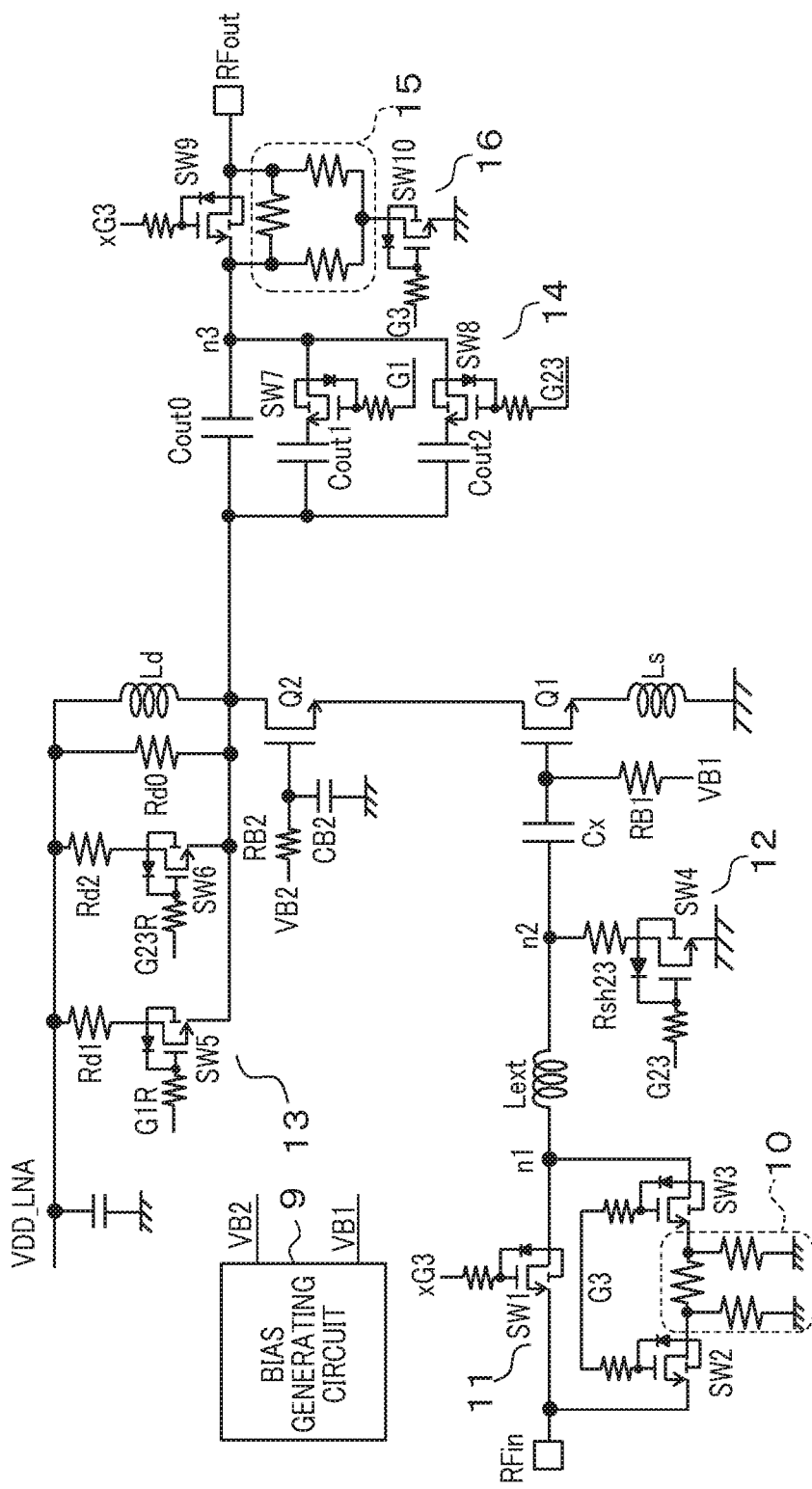
FIG. 2 is a circuit diagram showing the internal configuration of the LNA according to the first embodiment.

FIG. 2 is a circuit diagram showing the internal configuration of the LNA 1 according to the first embodiment. The LNA 1 of FIG. 2 has a function of selecting any one of four gain modes G0 to G3 different in gain from one another. The gain is highest in the G0-mode, becoming lower in the order of G0→G1→G2→G3.

The LNA 1 of FIG. 2 is provided with a common-source first transistor Q1 for amplifying a high-frequency input signal, a common-gate second transistor Q2 for further amplifying a signal amplified by the first transistor Q1 to generate an output signal, a bias generating circuit 9, a first inductor Ls, a second inductor Ld, a first attenuator 10, a first switch 11, a first resistor Rsh23, a second switch 12, a plurality of second resistors Rd0, Rd1 and Rd2, a third switch 13, a plurality of first capacitors Cout0, Cout1 and Cout2, a fourth switch 14, a second attenuator 15, and a fifth switch 16.

Although the first transistor Q1 and the second transistor Q2 of FIG. 2 are NMOS transistors, both can be configured with PMOS transistors in design. Nevertheless, since electrical characteristics are better in the form of NMOS, hereinafter, an example of the first transistor Q1 and the second transistor Q2 configured with NMOS transistors will be explained.

An input signal path is connected to the gate of the first transistor Q1. On the input signal path, an input terminal RFin, the first attenuator 10, the first switch 11, an externally-attached inductor (third inductor) Lext, and the first resistor Rsh23 are connected.

The first switch 11 has first to third transistor switches SW1 to SW3. The first transistor switch SW1 is connected between the input terminal RFin and a node n1 that is an end of the externally-attached inductor Lext. The second transistor switch SW2 is connected between the input terminal RFin and an end of the first attenuator 10. The third transistor switch SW3 is connected between the other end of the first attenuator 10 and the node n1. To the gate of the first transistor switch SW1, a signal xG3, which becomes high in a gain mode other than the G3-mode, is input. The first transistor switch SW1 turns on in a gain mode other than the G3-mode and turns off in the G3-mode. A signal G3 which becomes high in the G3-mode is input to the gates of the second transistor switch SW2 and the third transistor switch SW3. The second transistor switch SW2 and the third transistor switch SW3 turn on in the G3-mode and turn off in the G0- to G2-modes.

As described above, since the input and output of the first attenuator 10 are cut off in the G0- to G2-modes, the high-frequency input signal bypasses the first attenuator 10 by the first transistor switch SW1 to be input to the externally-attached inductor Lext. The first attenuator 10 may be formed in a π-shape configuration as shown in FIG. 2 or in a T-shape configuration.

The externally-attached inductor Lext is provided for impedance matching. A design is made so that the impedance viewed from the externally-attached inductor Lext to the input terminal RFin is 50Ω. The externally-attached inductor Lext can be formed on an SOI substrate, instead of being externally attached. In this case, however, a large pattern area is necessary, and hence it is highly likely that the inductor Lext is externally attached practically. Accordingly, in the present specification, the inductor Lext is referred to as an externally-attached inductor Lext. In the LNA 1 of FIG. 2, the circuit components other than the externally-attached inductor Lext can be arranged on the SOI substrate. Practically, pads are provided to the node n1 and to a node n2, and then the externally-attached inductor Lext is connected between these pads.

The first inductor Ls is connected between the source of the first transistor Q1 and a ground node. To the gate of the first transistor Q1, a bias voltage VB1 is supplied via an resistor RB1. A capacitor Cx is connected on an input signal path between the gate of the first transistor Q1 and the node n2 at the other end of the externally-attached inductor Lext. The capacitor Cx cuts D. C. components of a high-frequency input signal on the input signal path.

Between the node n2 and a ground node, the first resistor Rsh23 and the second switch 12 are connected in series. The second switch 12 has a fourth transistor switch SW4. A signal G23, which becomes high in the G2- or G3-mode, is input to the gate of the fourth transistor switch SW4. Therefore, the fourth transistor switch SW4 turns on in the G2- or G3-mode and turns off in the other gain modes.

The first resistor Rsh23 functions as a shunt resistor when the fourth transistor switch SW4 in the second switch 12 is on. When the fourth transistor switch SW4 is off, the first resistor Rsh23 is cut off from the input signal path. Therefore, in the G2- or G3-mode, the first resistor Rsh23 functions as the shunt resistor, and performs an operation of lowering the gain of the high-frequency input signal. In the G0- or G1-mode, the first resistor Rsh23 does not perform the operation of lowering the gain of the high-frequency input signal.

A capacitor Cin, not shown, may be connected between the gate and source of the first transistor Q1. Since the source of the first transistor Q1 is connected to the ground node via the first inductor Ls, the first transistor Q1 acts as a common-source amplifier.

The externally-attached inductor Lext, the capacitors Cx and Cin, and the first inductor Ls constitute an input matching circuit. The element value of each component of the input matching circuit is set in consideration of gain matching and noise matching of the first transistor Q1.

To the gate of the second transistor Q2, a bias voltage VB2 is supplied via a resistor RB2. A capacitor CB2 is connected between the gate of the second transistor Q2 and a ground node. Since the capacitance of the capacitor CB2 and the resistance value of the resistor RB2 are both large enough, the second transistor Q2 acts as a common-gate amplifier.

Between the drain of the second transistor Q2 and a first reference potential VDD_LNA, a second inductor Ld and the plurality of second resistors Rd0, Rd1 and Rd2 are connected in parallel, and a third switch 13 that selects at least one of the plurality of second resistors Rd0, Rd1 and Rd2 is provided.

The third switch 13 has a fifth transistor switch SW5 and a sixth transistor switch SW6. The fifth transistor switch SW5 is connected in series to the second resistor Rd1. The sixth transistor switch SW6 is connected in series to the second resistor Rd2. The fifth transistor switch SW5 turns on when a gate signal G1R is high. The gate signal G1R becomes high in the G1-mode. Therefore, the second resistor Rd1 is connected in parallel to the second resistor Rd0 and the second inductor Ld in the G1-mode. The sixth transistor switch SW6 turns on when a gate signal G23R is high. The gate signal G23R becomes high in the G2- or G3-mode. Therefore, the second resistor Rd2 is connected in parallel to the second resistor Rd0 and the second inductor Ld in the G2- or G3-mode.

As described above, in the G0-mode, only the second resistor Rd0 is connected in parallel to the second inductor Ld. In the G1-mode, the second resistors Rd0 and Rd1 are connected in parallel to the second inductor Ld. In the G2- or G3-mode, the second resistors Rd0 and Rd2 are connected in parallel to the second inductor Ld.

The plurality of second resistors Rd0, Rd1 and Rd have a relation of Rd0>Rd1>Rd2 in resistance value. Therefore, the resistance value of the second resistors connected in parallel to the second inductor Ld becomes maximum in the G0-mode, large in the G1-mode, and minimum in the G2- and G3-modes. As the resistance value of the second resistors is smaller, the gain of the output signal can be reduced.

Between the drain of the second transistor Q2 and an output terminal RFout, the plurality of first capacitors Cout0, Cout1 and Cout2 are connected in parallel, and the fourth switch 14 that selects at least one of the plurality of first capacitors Cout0, Cout1 and Cout2 is provided. The fourth switch 14 has a seventh transistor switch SW7 and an eighth transistor switch SW8. The seventh transistor switch SW7 is connected in series to the first capacitor Cout1. The seventh transistor switch SW7 turns on when a gate signal G1 is high. The gate signal G1 becomes high in the G1-mode. Therefore, the first capacitor Cout1 is connected in parallel to the first capacitor Cout0 in the G1-mode. The eighth transistor switch SW8 is connected in series to the first capacitor Cout2. The eighth transistor switch SW8 turns on when a gate signal G23 is high. The gate signal G23 becomes high in the G2- or G3-mode. Therefore, the first capacitor Cout2 is connected in parallel to the first capacitor Cout0 in the G2- or G3-mode.

Accordingly, the capacitance of the plurality of first capacitors Cout0, Cout1 and Cout2 in the G0- to G3-modes is the minimum Cout0 in the G0-mode, Cout0+Cout1 in the G1-mode, and Cout0+Cout2 in the G2- and G3-modes, becoming larger in this order. By adjusting the combined capacitance of the plurality of first capacitors, the output matching in each gain mode can be optimized.

Since the LNA 1 according to the present embodiment is formed on the SOI substrate, the first inductor Ls and the second inductor Ld are formed in spiral inductors made of a spiral wiring pattern. Having large inductance as described above, the externally-attached inductor Lext is, not formed on the SOI substrate, but externally attached to the LNA 1.

In the LNA 1 of FIG. 1, the second attenuator 15 and the fifth switch 16 are connected between the first capacitor Cout0 and the output terminal RFout. However, the second attenuator 15 and the fifth switch 16 may be omitted. The second attenuator 15 may be formed in a t-shape configuration or in a T-shape configuration, in the same manner as the first attenuator 10.

The fifth switch 16 has a ninth transistor switch SW9 and a tenth transistor switch SW10. The ninth transistor switch SW9 is connected between a node n3 that is one end of the first capacitor Cout and the output terminal RFout. The tenth transistor switch SW10 is connected between the second attenuator 15 and a ground node. The ninth transistor switch SW9 turns on when the signal xG3 is high. The signal xG3 becomes high in the modes other than the G3-mode. Therefore, the ninth transistor switch SW9 turns on in the G0- to G2-modes to make the second attenuator 15 bypassed. The tenth transistor switch SW10 turns on when a signal G3 is high. The signal G3 becomes high in the G3-mode. Therefore, the tenth transistor switch SW10 connects the second attenuator 15 between the output signal path and the ground node in the G3-mode.

The bias generating circuit 9 generates the bias voltages VB1 and VB2. The resistors RB1 and RB2 are provided to prevent the high-frequency input signal from being input to the bias generating circuit 9. The bias voltage VB1 is different in voltage value depending on the gain mode. Specifically, the voltage value of the bias voltages VB1 and VB2 are maximum in the G0- and G1-modes, large next to the maximum in the G2-mode, and minimum in the G3-mode.

FIG. 3 is a figure showing the voltage values of the bias voltages VB1 and VB2, and of the gate signals G1, G1R, G23, G23R, G3 and xG3 to be input to the gates of the first to tenth transistor switches SW1 to SW10 of FIG. 2 in the respective modes. As shown in FIG. 3, in the G0-mode, the bias voltage VB1 and the bias voltage VB2 are set to maximum VB1_G0 and maximum VB2_G0, respectively. Moreover, in the G0-mode, the gates signals G1, G1R, G23, G23R, G3 and xG3 are set to −2 volts, 0 volts, −2 volts, 0 volts, −2 volts, and 3 volts, respectively. Therefore, the first transistor switch SW1 turns on to make the first attenuator 10 bypassed. The first resistor Rsh23, which is a bypass resistor, is cut off from the input signal path. To the second inductor Ld, only the second resistor Rd0 is connected in parallel. To the output signal path, only the first capacitor Cout0 is connected. The second attenuator 15 is cut off from the output signal path. Accordingly, in the G0-mode, the high-frequency input signal is input to the gate of the first transistor Q1 without being attenuated. The second resistors connected in parallel to the second inductor Ld have a maximum value. Therefore, a maximum gain can be obtained in the G0-mode.

The threshold voltage of each of the transistor switches SW1 to SW10 is 0 volts. There are two cases of applying 0 volts and −2 volts to the gates in turning off the transistor switches SW1 to SW10. It is basically desirable to apply −2 volts to each gate because holes accumulated in the transistor body can be sucked into the gate. However, in the case where the drain of a transistor switch is connected to 1.8-volt power supply voltage, when the gate is at −2 volts, a voltage exceeding 3 volts is applied between the drain and gate, which exceeds a withstand voltage. For this reason, the gate is set at 0 volts when a high drain voltage is applied. In FIG. 2, a gate signal sign is followed by a sign "R" in the case of applying 0 volts to the gate of a transistor switch when the transistor switch is off. In the case where a gate signal sign is not followed by the sign "R", −2 volts is applied to the gate of a transistor switch when the transistor switch is off.

In the G1-mode, as shown FIG. 3, the bias voltage VB1 and the bias voltage VB2 are set to VB1_G1 and VB2_G1, respectively, each being a large value next to that in the G0-mode. The gate signals G1, G1R, G23, G23R, G3 and xG3 are set to 3 volts, 3 volts, −2 volts, 0 volts, −2 volts and 3 volts, respectively. Therefore, the first transistor switch SW1 turns on to make the first attenuator 10 bypassed. The first resistor Rsh23 is cut off from the input signal path. To the second inductor Ld, the second resistors Rd0 and Rd1 are connected in parallel. To the output signal path, the first capacitors Cout0 and Cout1 are connected in parallel. The second attenuator 15 is cut off from the output signal path. Accordingly, in the G1-mode, the high-frequency input signal is input to the gate of the first transistor Q1 without being attenuated. The second resistors connected in parallel to the second inductor Ld have a small value next to that in the G0-mode. Therefore, in the G1-mode, a high gain next to that in the G0-mode can be obtained.

In the G2-mode, as shown FIG. 3, the bias voltage VB1 and the bias voltage VB2 are set to VB1_G2 and VB2_G2, respectively, each being a large value next to that in the G1-mode. The gate signals G1, G1R, G23, G23R, G3 and xG3 are set to −2 volts, 0 volts, 3 volts, 3 volts, −2 volts and 3 volts, respectively. Therefore, the first transistor switch SW1 turns on to make the first attenuator 10 bypassed. Moreover, the fourth transistor switch SW4 turns on to connect the first resistor Rsh23 between the input signal path and the ground node. To the second inductor Ld, the second resistors Rd0 and Rd2 are connected in parallel. To the output signal path, the first capacitors Cout0 and Cout2 are connected in parallel. The second attenuator 15 is cut off from the output signal path. Accordingly, in the G2-mode, the high-frequency input signal is attenuated by the first resistor Rsh23 to be input to the gate of the first transistor Q1. The second resistors connected in parallel to the second inductor Ld have a small value next to that in the G1-mode. Therefore, in the G2-mode, a high gain next to that in the G1-mode can be obtained.

In the G3-mode, as shown FIG. 3, the bias voltage VB1 and the bias voltage VB2 are set to VB1_G3 and VB2_G3, respectively, each being the minimum. The gate signals G1, G1R, G23, G23R, G3 and xG3 are set to −2 volts, 0 volts, 3 volts, 3 volts, 3 volts and −2 volts, respectively. Therefore, the first transistor switch SW1 turns off while the second and third transistor switches SW2 and SW3 turn on, so that the high-frequency input signal, after being attenuated by the first attenuator 10, passes through the externally-attached inductor Lext. The fourth transistor switch SW4 turns on to connect the first resistor Rsh23 between the input signal path and the ground node. Accordingly, the high-frequency input signal on the input signal path is attenuated further. To the second inductor Ld, the second resistors Rd0 and Rd2 are connected in parallel. On the output signal path, the first capacitors Cout0 and Cout2 are connected in parallel. Since the ninth transistor switch SW9 turns off while the tenth transistor switch SW10 turns on, the second attenuator 15 is connected between the output signal path and the ground node, to attenuate the output signal. Accordingly, in the G3-mode, the output signal has a minimum gain.

Figures 4A, 4B:
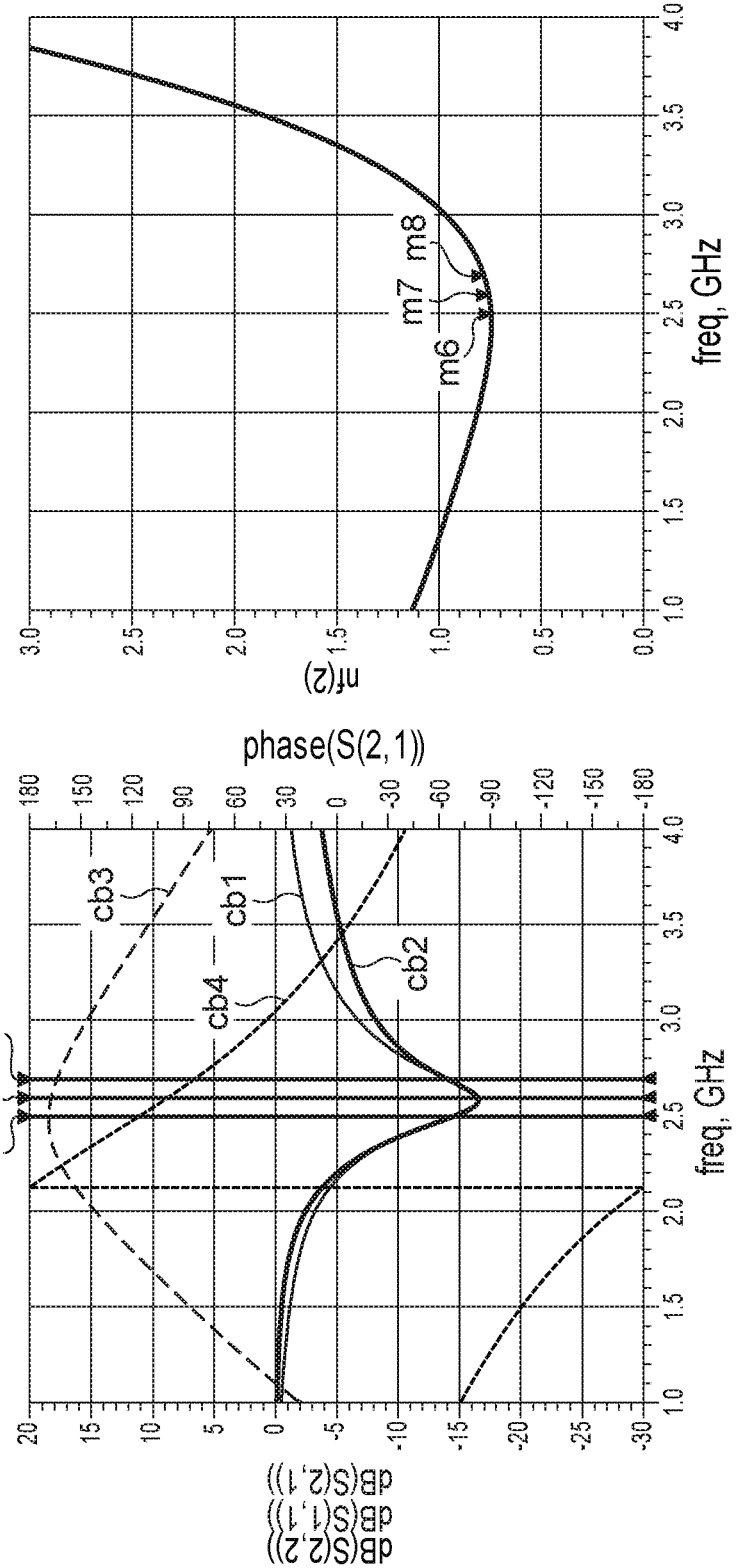
FIG. 4A is a figure showing S-parameters of the LNA of FIG. 2 in a G0-mode.
FIG. 4B is a figure showing noise figure NF of the LNA of FIG. 2 in the G0-mode.
Figure 5B:
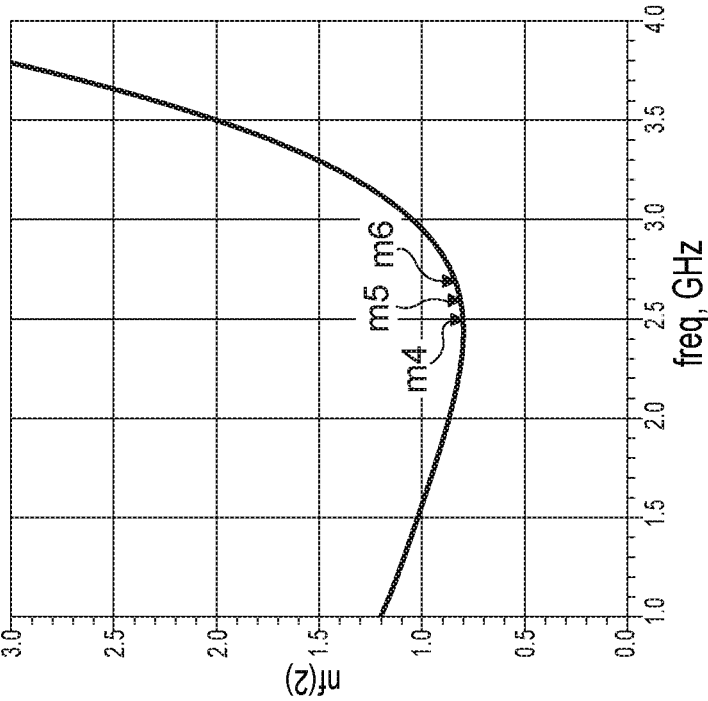
FIG. 5B is a figure showing noise figure NF of the LNA of FIG. 2 in the G1-mode.
Figure 5A:
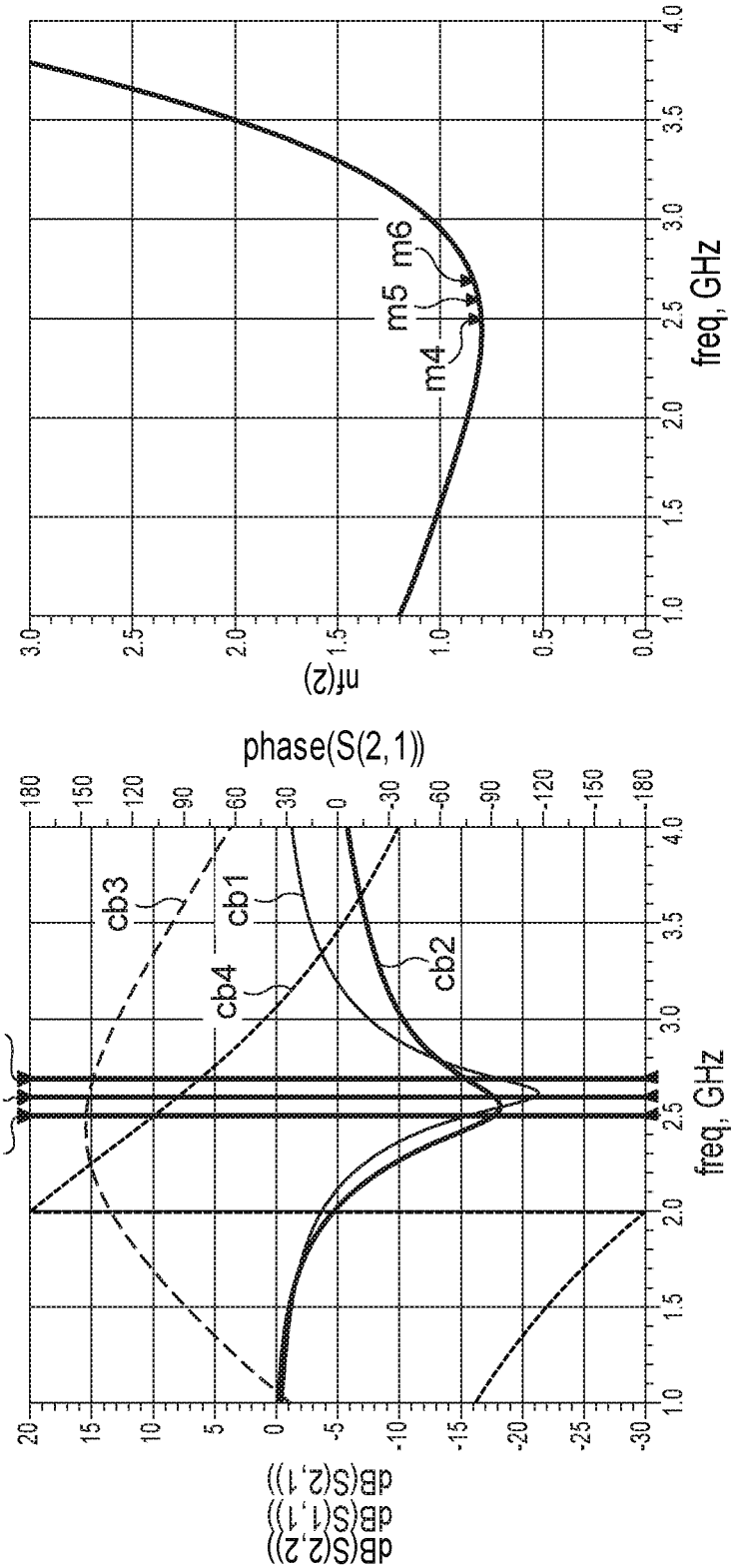
FIG. 5A is a figure showing S-parameters of the LNA of FIG. 2 in a G1-mode.
Figure 7B:
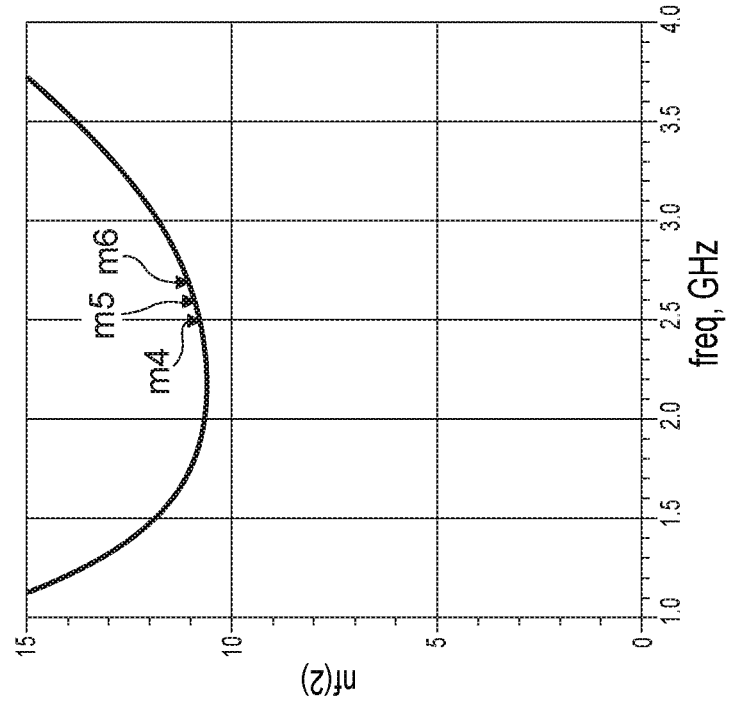
FIG. 7B is a figure showing noise figure NF of the LNA of FIG. 2 in the G3-mode.
Figure 7A:
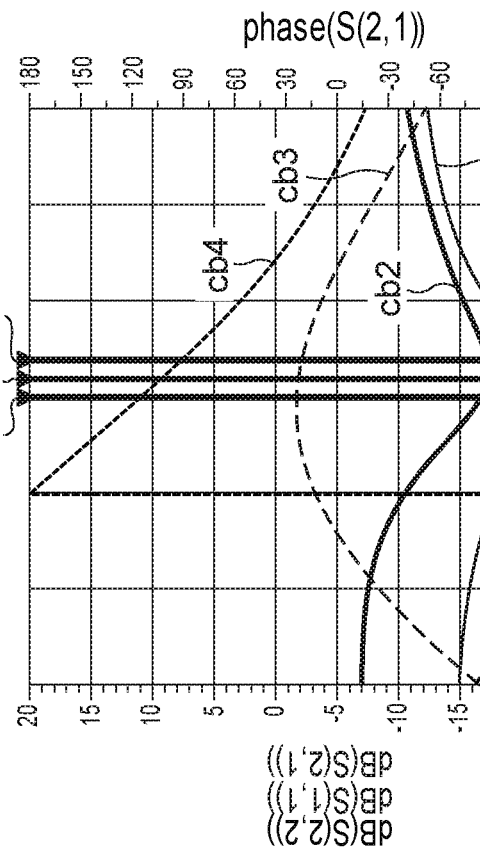
FIG. 7A is a figure showing S-parameters of the LNA of FIG. 2 in a G3-mode.

FIG. 4A is a figure showing S-parameters of the LNA 1 of FIG. 2 in the G0-mode. In FIG. 4A, the abscissa is frequency [GHz] and the ordinate is S-parameter value [dB]. In FIG. 4A, curves cb1, cb2, cb3, and cb4 represent input-side reflection characteristics S11, output-side reflection characteristics S22, transmission characteristics S21 from the input side, and phase of S21, respectively.

FIG. 4B is a figure showing noise figure NF of the LNA 1 of FIG. 2 in the G0-mode. In FIG. 4B, the abscissa is frequency [GHz] and the ordinate is noise figure NF.

In FIG. 4A and FIG. 4B, marks are put on 2.496 GHz, 2.593 GHz, and 2.690 GHz in a frequency range of Band 41 that is one of LTE (Long Term Evolution) bands. The LNA 1 according to the present embodiment is designed to be used in a frequency range of Band 41. As understood from FIG. 4A, the S-parameters in the frequency range of Band 41 are satisfactory. For example, the gain at the band center frequency of 2.593 GHz is 18.0 dB, with S11 and S22 keeping generally-required standard values (−12 dB or lower).

FIGS. 5A to 7A are figures showing S-parameters of the LNA 1 in FIG. 2 in the G1- to G3-modes, respectively. FIGS. 5B to 7B are figures showing noise figure NF of the LNA 1 in FIG. 2 in the G1- to G3-modes, respectively. As understood from these figures, the gain lowers in the order of G0→G1→G2→G3. The LNA 1 of FIG. 2 is designed to have the gain of about 18 dB, about 15 dB, about 9 dB, and about −3 dB in the G0-, G1-, G2-, and G3-modes, respectively.

Figure 8:
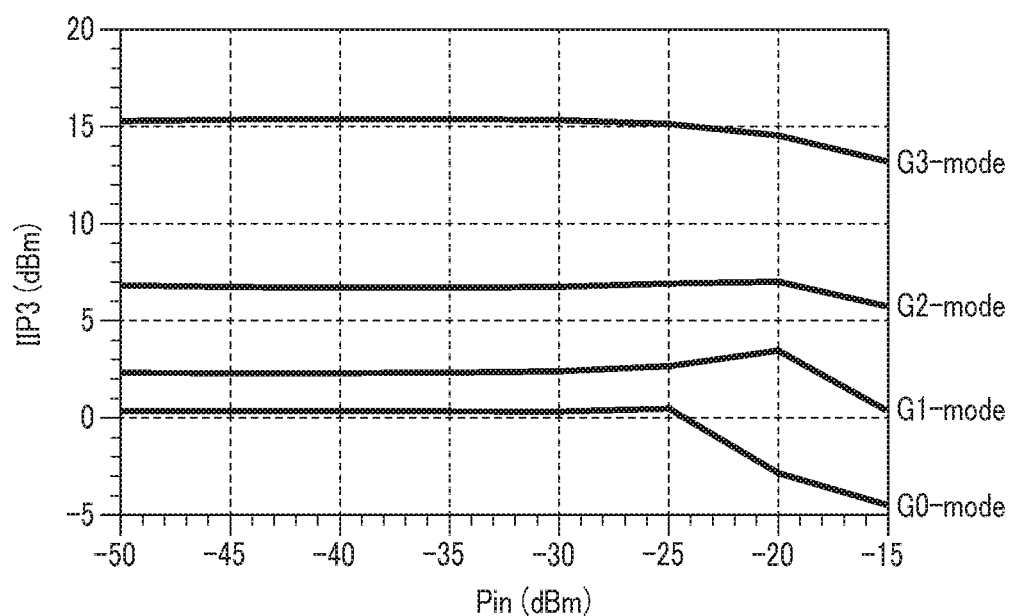
FIG. 8 is a figure showing IIP3 of the LNA in FIG. 2 in the respective modes.

FIG. 8 is a figure showing IIP3 of the LNA 1 in FIG. 2 in the respective modes. In FIG. 8, the abscissa is input signal power Pin [dBm] and the ordinate is IIP3 [dBm]. As shown in FIG. 8, although lowering in the order of G3→G2→G1→G0, IIP3 keeps a value sufficiently larger than a generally-required value. Especially, in the G3-mode, IIP3 shows a value that is 3.3 dB larger than a generally-required value of 12 dBm.

FIG. 9 is a figure showing a result of simulation in the G0- to G3-modes. FIG. 9 shows, in each gain mode, a bias current Idd_Ina [mA], a band center value [dB] of S21, a band center value [dB] of noise figure NF, the worst value [dB] in Band 41 of S11, the worst value [dB] in Band 41 of S22, a band center value [dBm] of IIP3, and the phase [deg] of S21.

From S21-phase in FIG. 9, the inter-gain mode maximum phase discontinuity [deg] is 10.57. It is found that this value has an enough margin to a generally-required value of 20 [deg].

As described above, according to the first embodiment, in the LNA 1 having a plurality of gain modes, the input signal path is connected to the ground node by means of the shunt resistor Rsh23 when the G3-mode of the minimum gain is selected, so that IIP3 can be improved.

Second Embodiment

A second embodiment is different from the first embodiment in shunt resistor circuit configuration.

Figure 10:
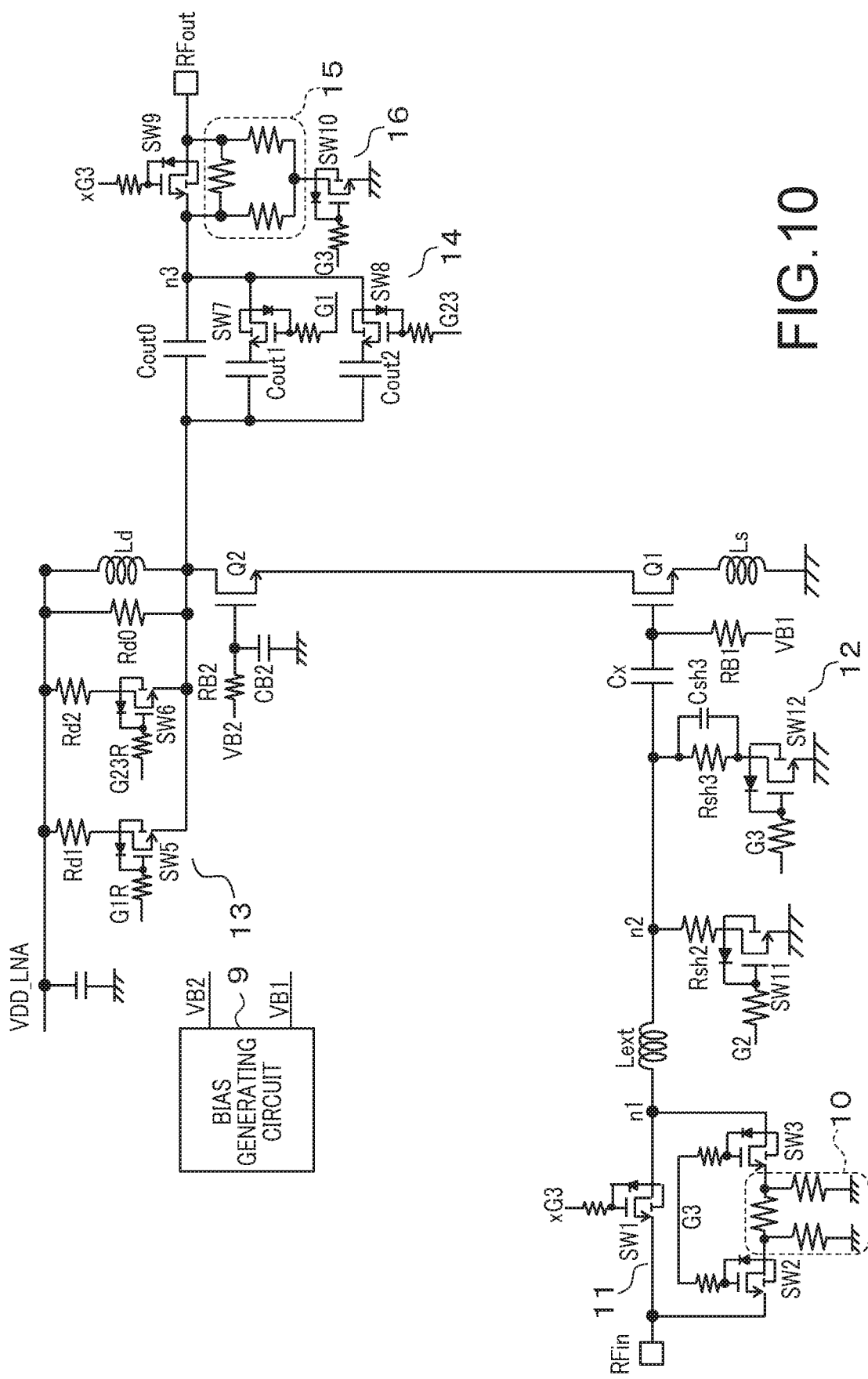
FIG. 10 is a circuit diagram of an LNA according to a second embodiment.

FIG. 10 is a circuit diagram of an LNA 1 according to the second embodiment. In FIG. 10, the components equivalent to those of FIG. 2 are given the same signs. In the following, the different points will be mainly explained. The LNA 1 of FIG. 2 is provided with the first resistor Rsh23 that functions as a shunt resistor in the G2- and G3-modes. In contrast, the LNA 1 of FIG. 10 is provided with a first resistor Rsh2 that functions as a shunt resistor in the G2-mode, a first resistor Rsh3 that functions as a shunt resistor in the G3-mode, and a second capacitor Csh3 connected in parallel to the first resistor Rsh3.

To the first resistor Rsh2, an eleventh transistor switch SW11 is connected in series, and to the first resistor Rsh3, a twelfth transistor switch SW12 is connected in series. The eleventh transistor switch SW11 turns on when a signal G2 is high. The twelfth transistor switch SW12 turns on when a signal G3 is high. Therefore, in the G2-mode, the first resistor Rsh2 is connected between the input signal path and the ground node. In the G3-mode, the first resistor Rsh3 and the second capacitor Csh3 are connected in parallel between the input signal path and the ground node.

According to the examination of the present inventor, it is found that IIP3 in the G3-mode becomes higher by connecting the second capacitor Csh3 in parallel to the first resistor Rsh3. Accordingly, according to the LNA 1 of FIG. 10, IIP3 in the G3-mode can be made higher than that in the LNA 1 of FIG. 1.

As described above, since the LNA 1 of FIG. 10 has the shunt resistor Rsh2 only for the G2-mode, and the shunt resistor Rsh3 and the second capacitor Csh3 only for the G3-mode, IIP3 in the G2- and G3-modes can be optimized.

Figure 11:
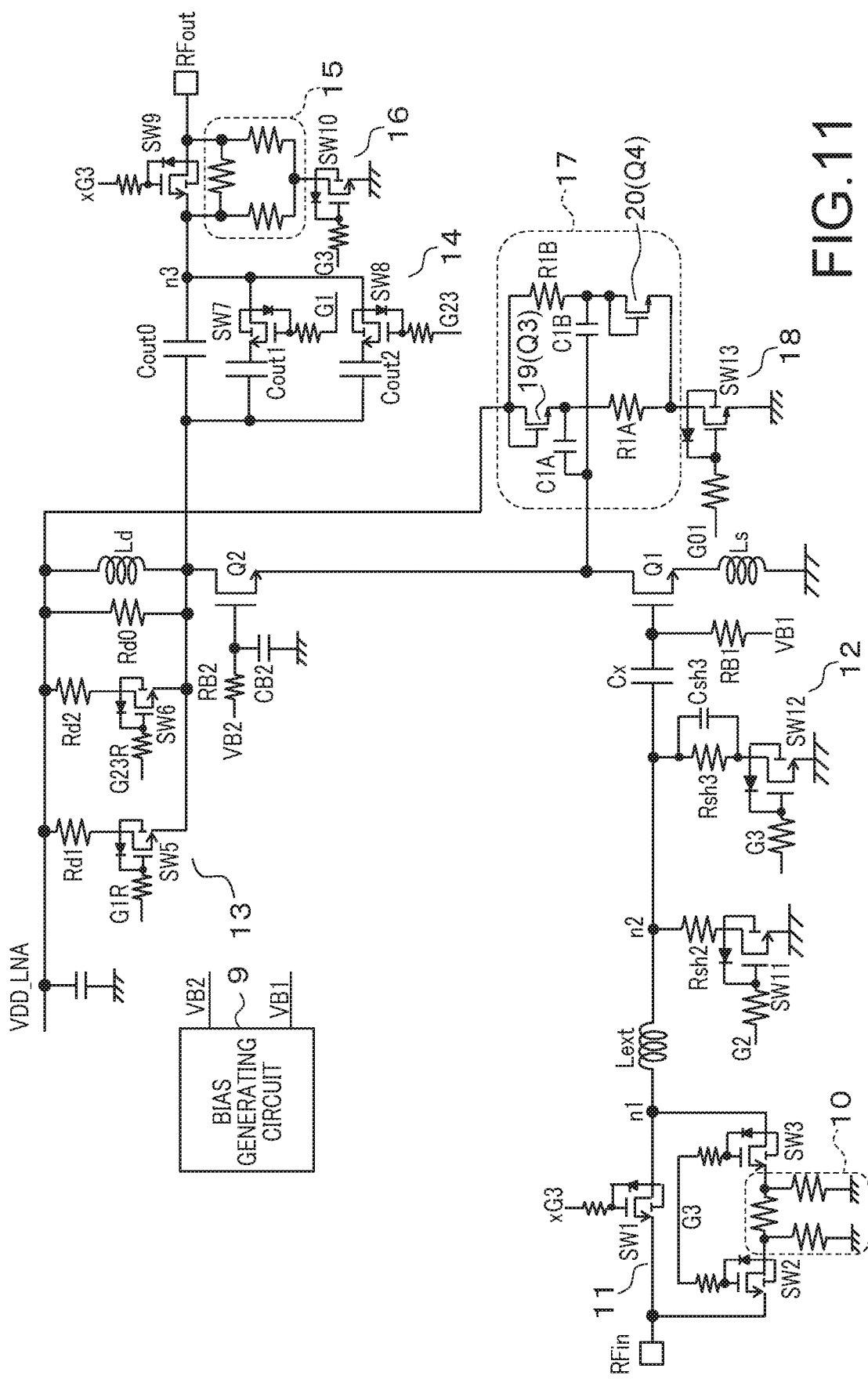
FIG. 11 is a circuit diagram of an LNA according to one modification example of that in FIG. 10.
Figure 13B:
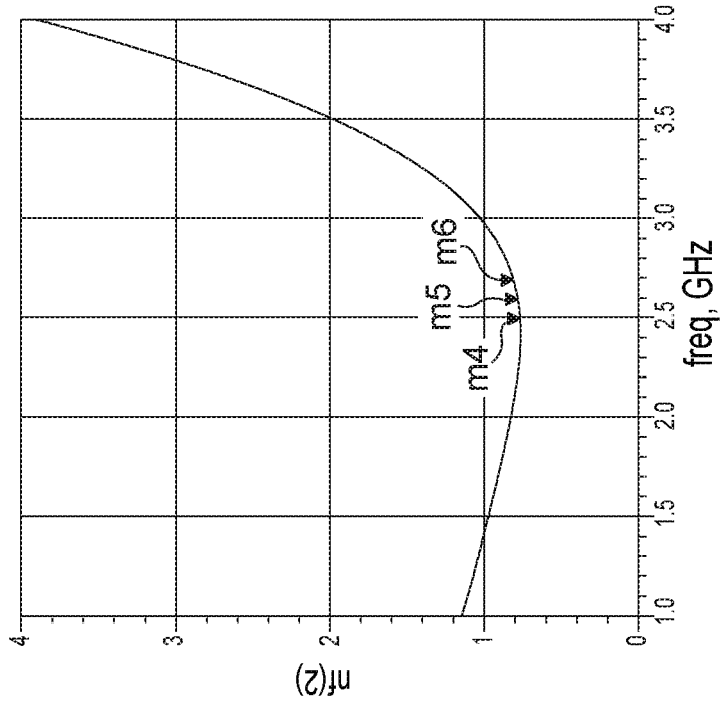
FIG. 13B is a figure showing noise figure NF of the LNA of FIG. 11 in the G0-mode.
Figure 13A:
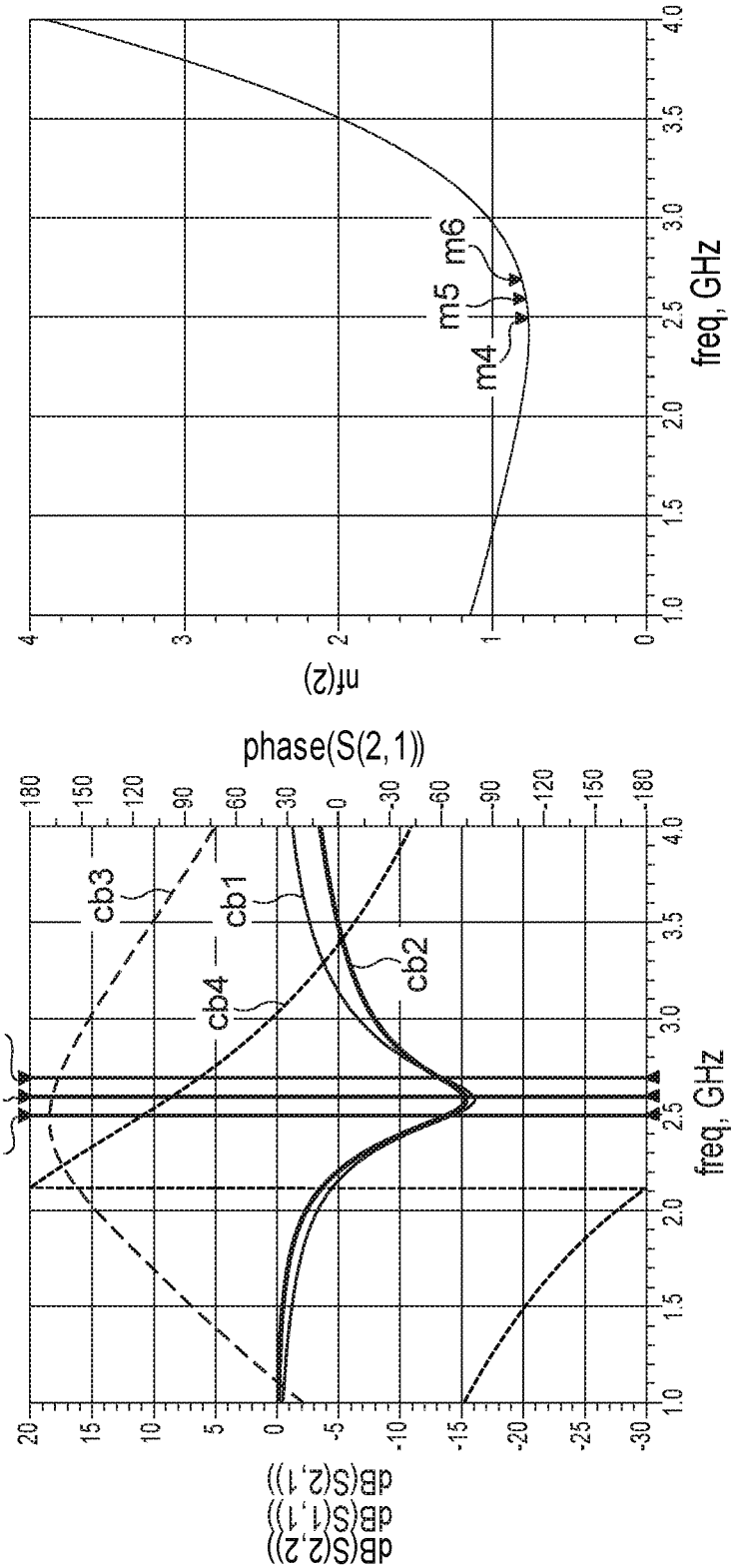
FIG. 13A is a figure showing S-parameters of the LNA of FIG. 11 in the G0-mode.
Figure 14B:
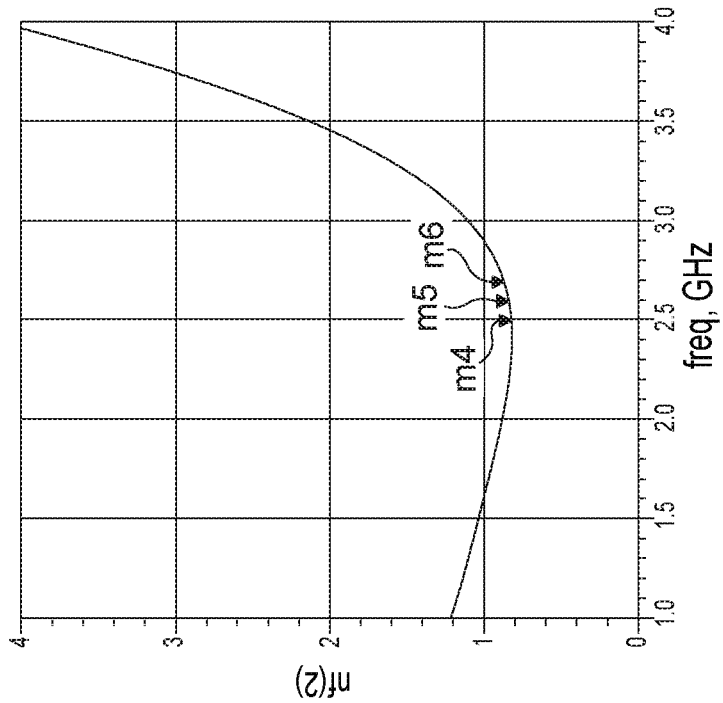
FIG. 14B is a figure showing noise figure NF of the LNA of FIG. 11 in the G1-mode.
Figure 14A:
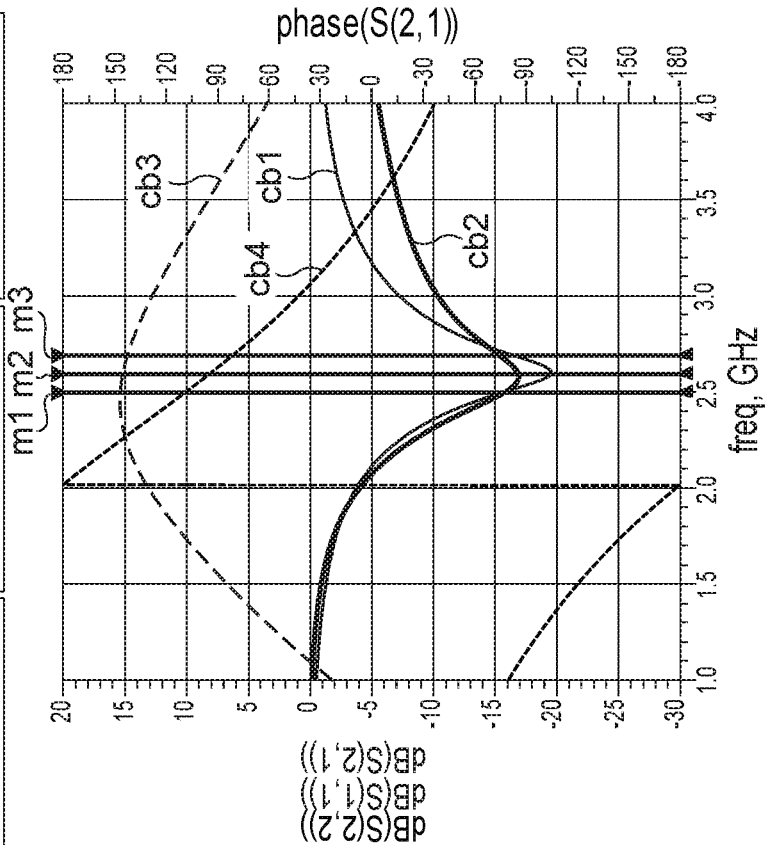
FIG. 14A is a figure showing S-parameters of the LNA of FIG. 11 in the G1-mode.
Figures 16A, 16B:
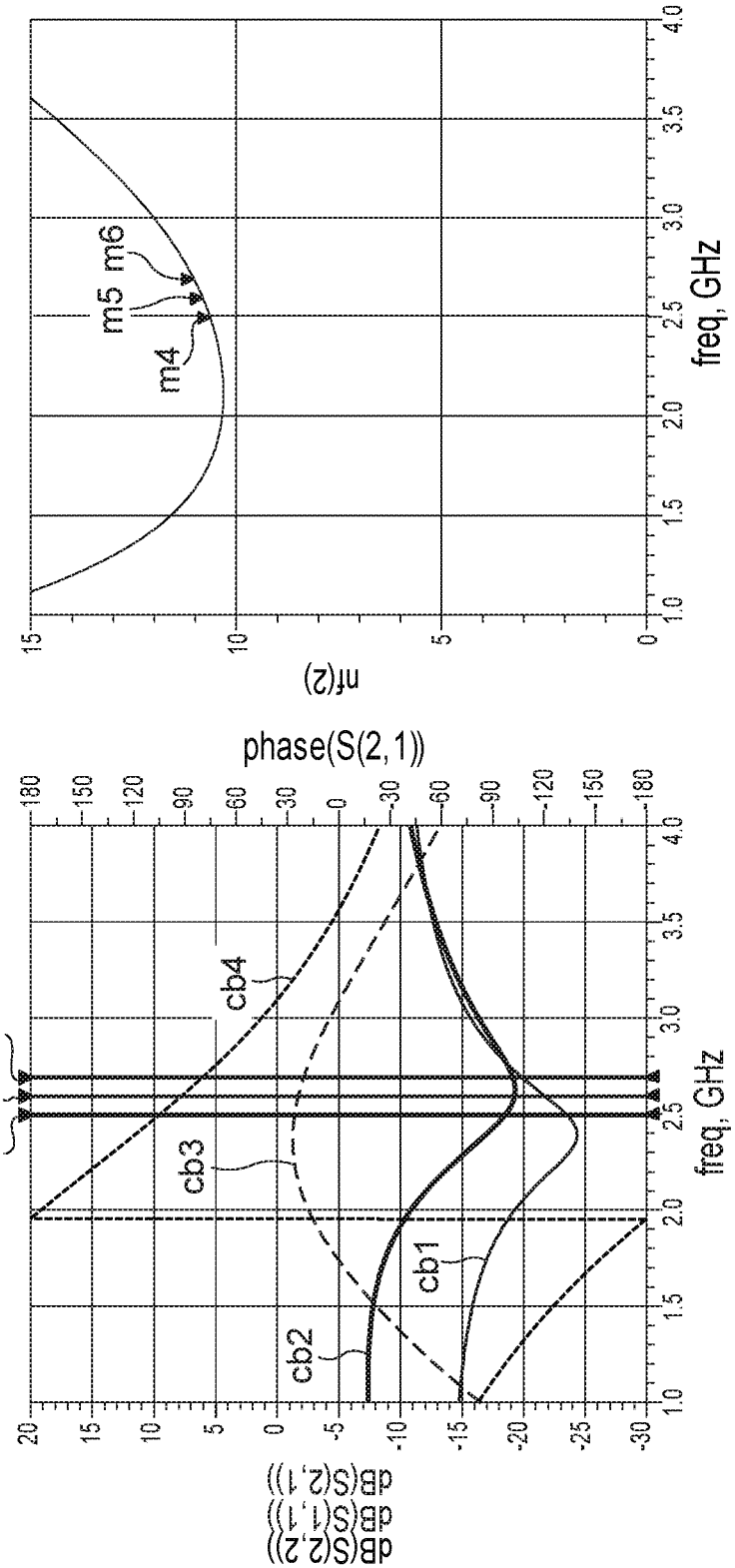
FIG. 16A is a figure showing S-parameters of the LNA of FIG. 11 in the G3-mode.
FIG. 16B is a figure showing noise figure NF of the LNA of FIG. 11 in the G3-mode.

FIG. 11 is a circuit diagram of an LNA 1 according to a modification example of that in FIG. 10. The LNA 1 of FIG. 11 is configured by adding a non-linearity compensation circuit 17 and a sixth switch 18 to the LNA 1 of FIG. 10. The non-linearity compensation circuit 17 of FIG. 11 is connected to a connection node of the first transistor Q1 and the second transistor Q2. In other words, the non-linearity compensation circuit 17 is connected to the drain of the first transistor Q1 and to the source of the second transistor Q2. To the non-linearity compensation circuit 17, the first reference potential VDD_LNA and the ground node are connected. Since it is enough for the non-linearity compensation circuit 17 to be connected between two reference potentials, the non-linearity compensation circuit 17 may be connected between a third reference potential other than VDD_LNA and a fourth reference potential other than the ground potential.

The non-linearity compensation circuit 17 is connected to the connection node of the first transistor Q1 and the second transistor Q2 to compensate for non-linearity of an output signal to a high-frequency input signal. The sixth switch 18 selects whether to make effective the non-linearity compensation circuit 17 that compensates for non-linearity of the output signal output from the output signal path to the high-frequency input signal.

The non-linearity compensation circuit 17 has a first rectifier circuitry 19, a second rectifier circuitry 20, a resistor R1A, a resistor R1B, a third capacitor C1A, and a fourth capacitor C1B. The sixth switch 18 has a thirteenth transistor switch SW13.

The first rectifier circuitry 19 and the resistor R1A are connected in series between the first reference potential VDD_LNA and the drain of the thirteenth transistor switch SW13. The resistor R1B and the second rectifier circuitry 20 are connected in series between the first reference potential VDD_LNA and the drain of the thirteenth transistor switch SW13.

The connection node of the first rectifier circuitry 19 and the resistor R1A is connected, via the third capacitor C1A, to the connection node of the first transistor Q1 and the second transistor Q2. Likewise, the connection node of the resistor R1B and the second rectifier circuitry 20 is connected, via the fourth capacitor C1B, to the connection node of the first transistor Q1 and the second transistor Q2.

The thirteenth transistor switch SW13 turns on when a signal G01 is high to make an end of the resistor R1A and an end of the second rectifier circuitry 20 conductive to the ground node. Therefore, in the G0- and G1-modes, the non-linearity compensation circuit 17 compensates for non-linearity of the output signal to the high-frequency input signal. In the G2- and G3-modes, the non-linearity compensation circuit 17 is cut off.

The first rectifier circuitry 19 has a diode-connected third transistor Q3. The second rectifier circuitry 20 has a diode-connected fourth transistor Q4. To the drain and gate of the third transistor Q3, the first reference potential VDD_LNA is connected, and to the source of the third transistor Q3, an end of the resistor R1A is connected. To the drain and gate of the fourth transistor Q4, an end of the resistor R1B is connected, and to the source of the third transistor Q3, the ground node is connected.

The third transistor Q3 and the fourth transistor Q4 have the same device constants. The device constants are various parameters such as a gate width, a gate length, a threshold voltage, and a gate-oxide film thickness, which define the transistor electrical characteristics. The resistors R1A and R1B have the same resistance value. The third capacitor C1A and the fourth capacitor C1B have the same capacity.

As described above, the non-linear compensation circuit 17 is provided with two series circuits each configured with of a transistor and a resistor, in a reverse order of transistor-resistor connection, vice versa, in these series circuits. According to this configuration, even-order intermodulation distortion can be canceled.

Moreover, in the non-linear compensation circuit 17 according to the present embodiment, in order to have high IIP3 as much as possible in the G0- and G1-modes, at least one of the device constants of the third transistor Q3 and the fourth transistor Q4, the resistance values of the resistors R1A and R1B, and the capacitance of the third capacitor C1A and the fourth capacitor C1B can be adjusted. According to the adjustment, IIP3 can be raised without reducing the gain and noise figure so much.

FIG. 12 is a figure showing the voltage values of the bias voltages VB1 and VB2, and of the gate signals G1, G1R, G01, G23, G23R, G3 and xG3 to be input to the gates of the first to tenth transistor switches SW1 to SW13 of the LNA 1 in FIG. 11 in the respective modes. In FIG. 12, compared to FIG. 3, logics for a signal G01 and G2 are added. The thirteenth transistor switch SW13, to which the signal G01 is input, turns on in the G0- and G1-modes.

FIGS. 13A to 16A are figures showing S-parameters of the LNA 1 in FIG. 11 in the G0- to G3-modes, respectively. FIGS. 13B to 16B are figures showing noise figure NF of the LNA 1 in FIG. 11 in the G0- to G3-modes, respectively.

FIG. 17 is a figure showing a result of simulation for the LNA 1 of FIG. 11 in the G0- to G3-modes. As understood from S21-phase in FIG. 17, the inter-gain mode maximum phase discontinuity [deg] is 9.76 which is smaller than that in FIG. 9.

Figure 18:
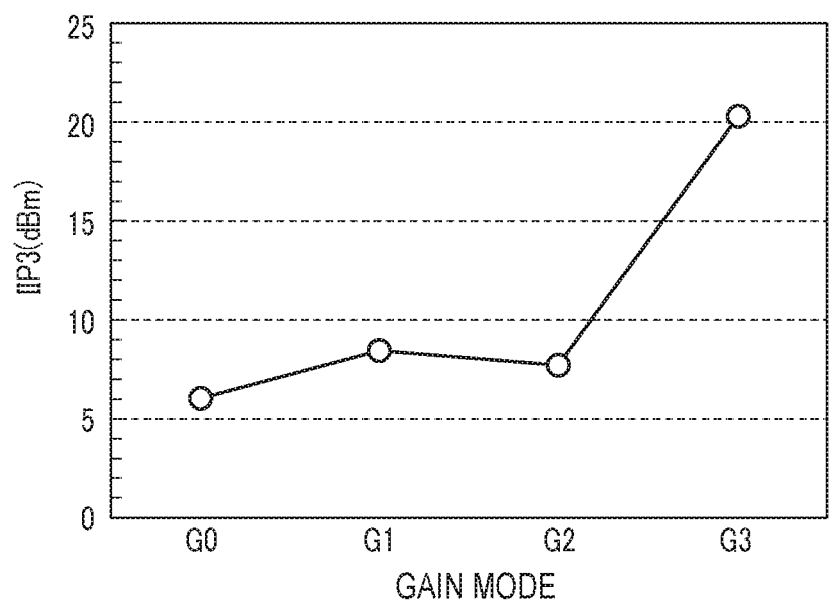
FIG. 18 is a figure graphing IIP3 in the respective gain modes shown in FIG. 17.

FIG. 18 is a figure graphing IIP3 in the respective gain modes shown in FIG. 17. In FIG. 18, the abscissa is gain mode and the ordinate is IIP3 [dBm]. As shown, by providing the non-linearity compensation circuit 17, IIP3 becomes higher in the G0- and G1-modes. Moreover, since there are provided the first resistor Rsh3, which is a shunt resistor, only for the G3-mode and the second capacitor Csh3 connected in parallel to the first resistor Rsh3, IIP3 becomes higher further in the G3-mode.

Figure 19:
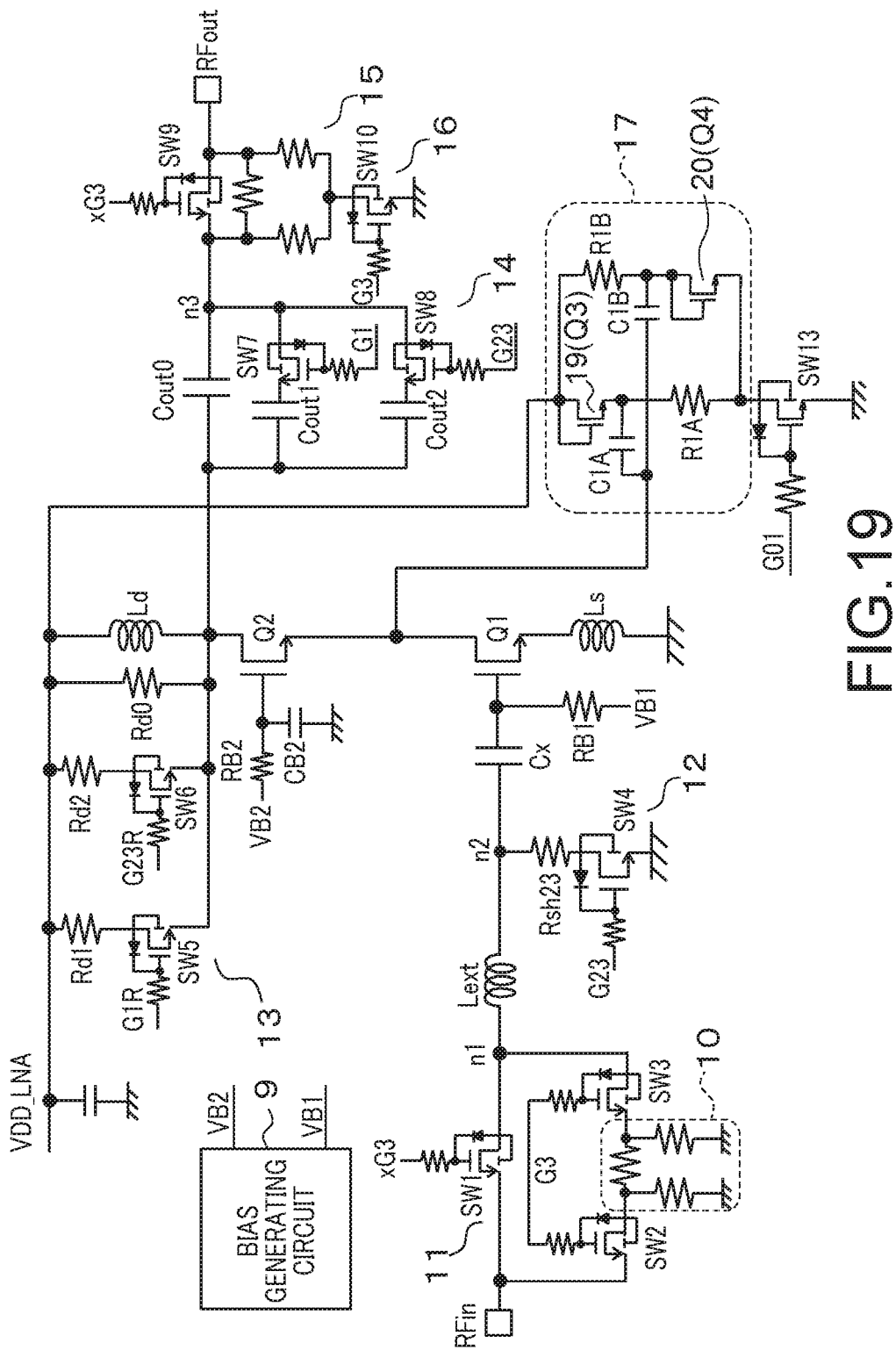
FIG. 19 is a circuit diagram configured by adding a non-linearity compensation circuit of the same circuit configuration as that of FIG. 11 to the LNA of FIG. 2.

The non-linearity compensation circuit 17 provided to the LNA 1 of FIG. 11 may be added to the LNA 1 of FIG. 2. FIG. 19 is a circuit diagram configured by adding a non-linearity compensation circuit 17 of the same circuit configuration as that of FIG. 11 to the LNA 1 of FIG. 2. According to the LNA 1 of FIG. 19, IIP3 can be raised further in the G0- and G1-modes, in the same manner as the LNA 1 of FIG. 11.

As described above, in the second embodiment, since the second capacitor Csh3 is connected in parallel to the first resistor Rsh3, which is a shunt resistor, connected between the input signal path, which is connected to the gate of the first transistor Q1, and the ground node, IIP3 can be raised further in the G3-mode.

Moreover, in the second embodiment, since the non-linearity compensation circuit 17 is connected to the connection node of the first transistor Q1 and the second transistor Q2 to compensate for non-linearity of the output signal to the high-frequency input signal in the G0- and G1-modes, IIP3 can be raised further in the G0- and G1-modes.

Third Embodiment

A third embodiment selects whether to connect a fifth resistor in parallel to the externally-attached inductor Lext.

Figure 20:
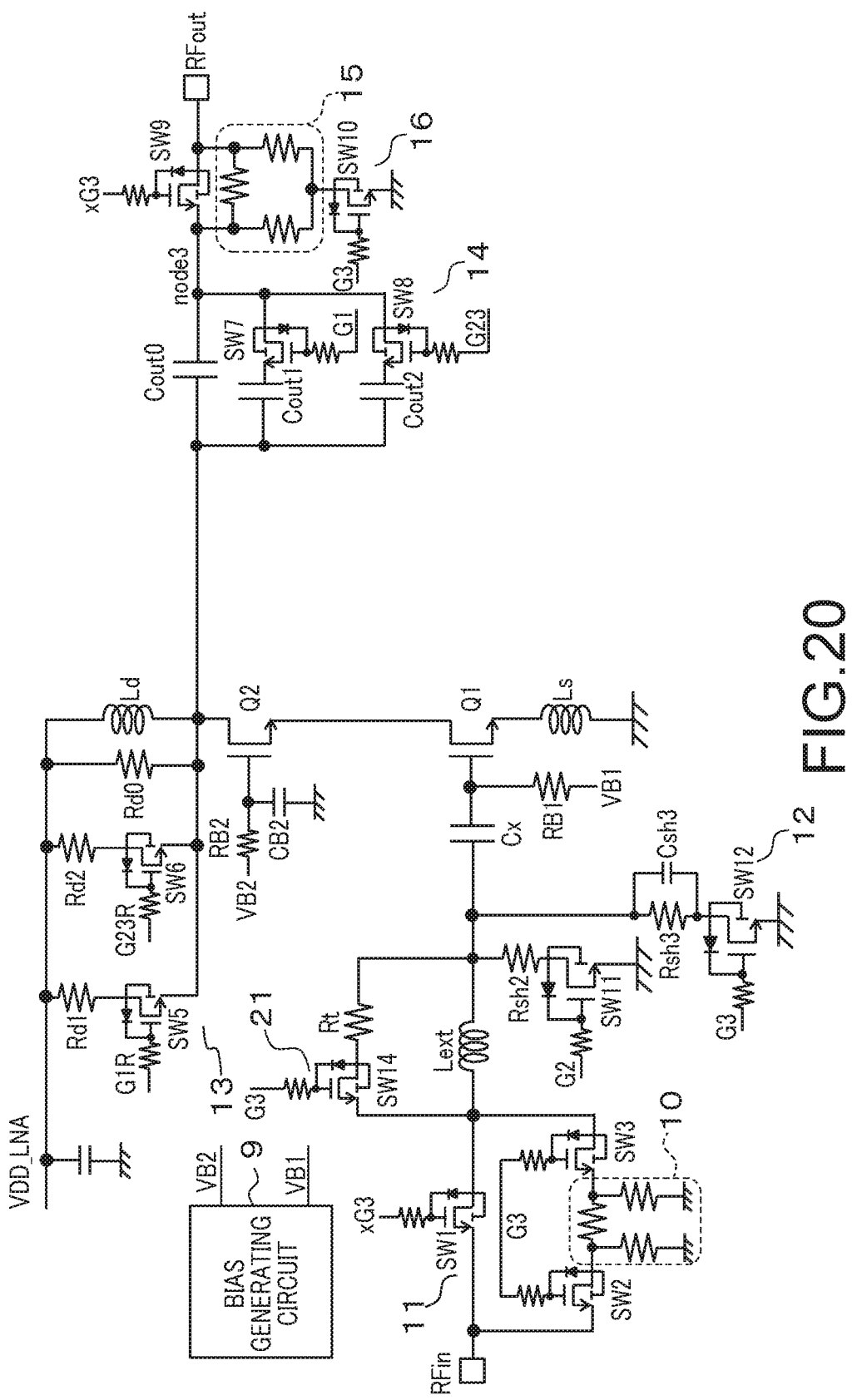
FIG. 20 is a circuit diagram of an LNA according to a third embodiment.

FIG. 20 is a circuit diagram of an LNA 1 according to the third embodiment. In the LNA1 of FIG. 20, the components equivalent to those of the LNA1 of FIG. 10 are given the same signs. In the following, the different points will be mainly explained. The LNA 1 of FIG. 20 is provided with a seventh switch 21 that selects whether to connect a fifth resistor Rt in parallel to the externally-attached inductor Lext. The seventh switch 21 is a fourteenth transistor switch SW14 that connects the fifth resistor Rt in parallel to the externally-attached inductor Lext when a signal G3 is high. In other words, in the G3-mode, the fifth resistor Rt is connected in parallel to the externally-attached inductor Lext whereas, in the G0- to G2-modes, the fifth resistor Rt is cut off, so that the externally-attached inductor Lext is left alone.

According to the examination of the present inventor, it is found that, by connecting the fifth resistor Rt in parallel to the externally-attached inductor Lext in the G3-mode, the input impedance varies to raise IIP3 further. Accordingly, the seventh switch 21 of FIG. 20 connects the fifth resistor Rt in parallel to the externally-attached inductor Lext only in the G3-mode.

Figure 21:
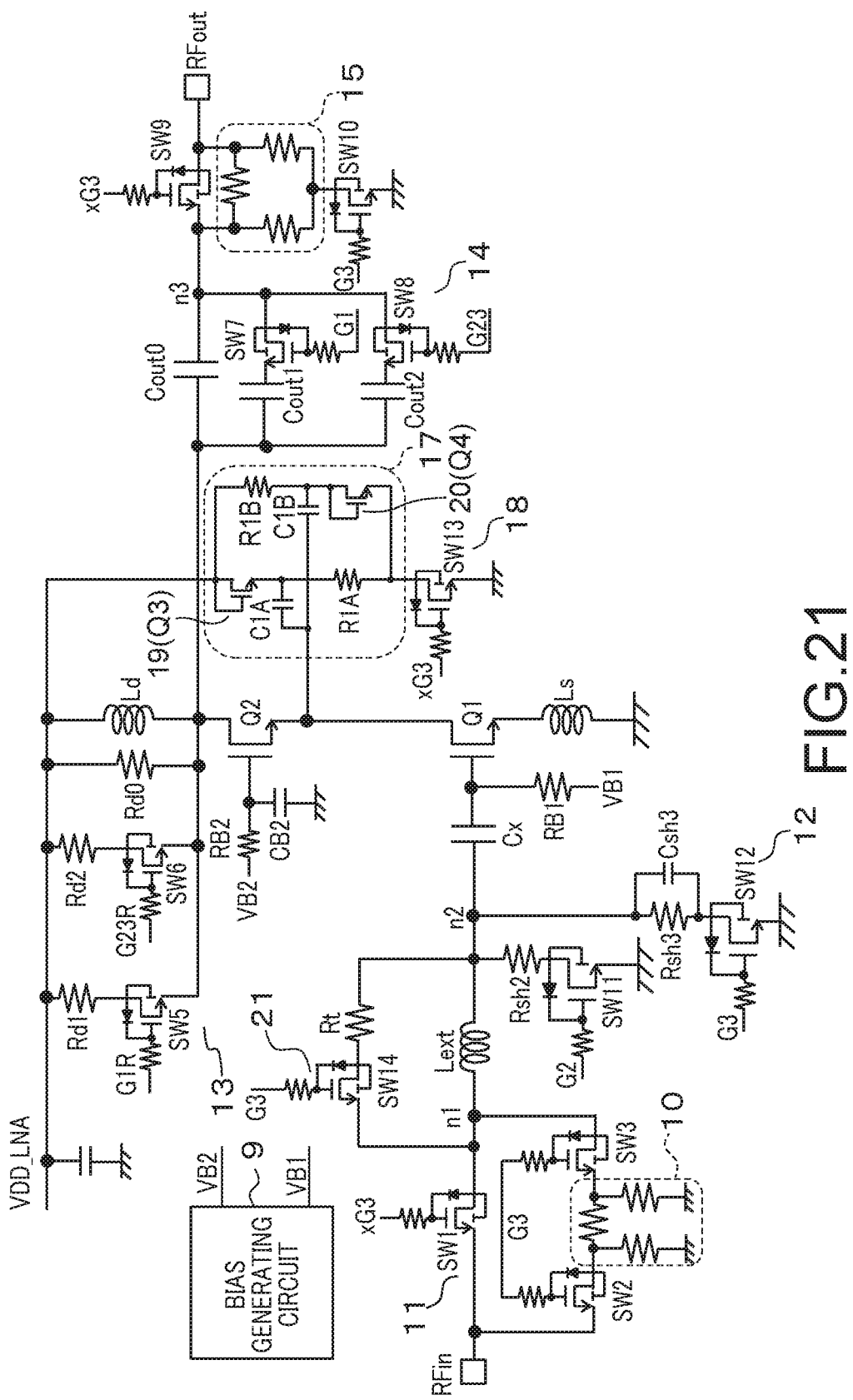
FIG. 21 is a circuit diagram configured by adding a non-linearity compensation circuit of the same circuit configuration as that of FIG. 11 to the LNA of FIG. 20.
Figures 23A, 23B:
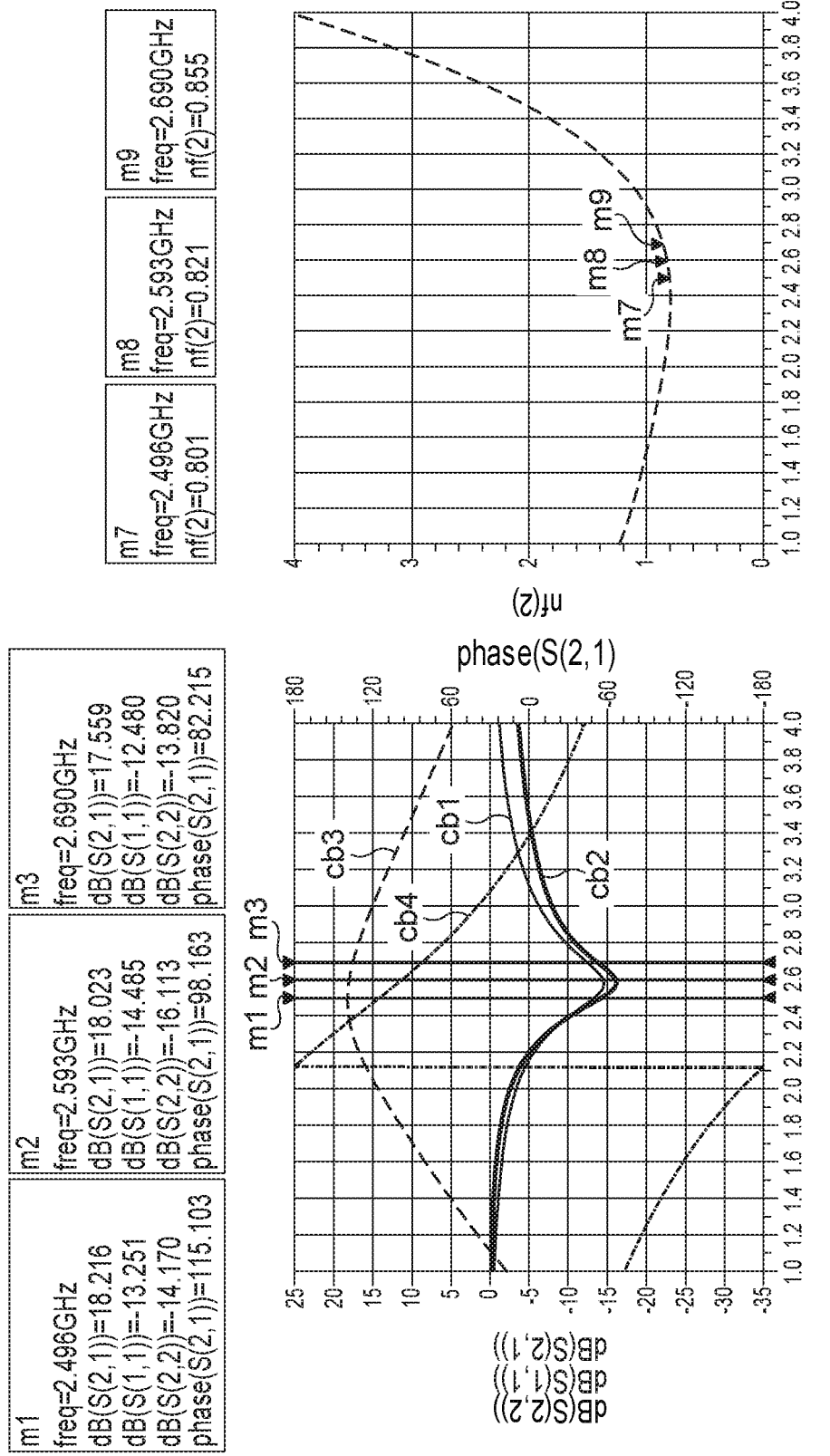
FIG. 23A is a figure showing S-parameters of the LNA of FIG. 21 in the G0-mode.
FIG. 23B is a figure showing noise figure NF of the LNA of FIG. 21 in the G0-mode.
Figures 24A, 24B:
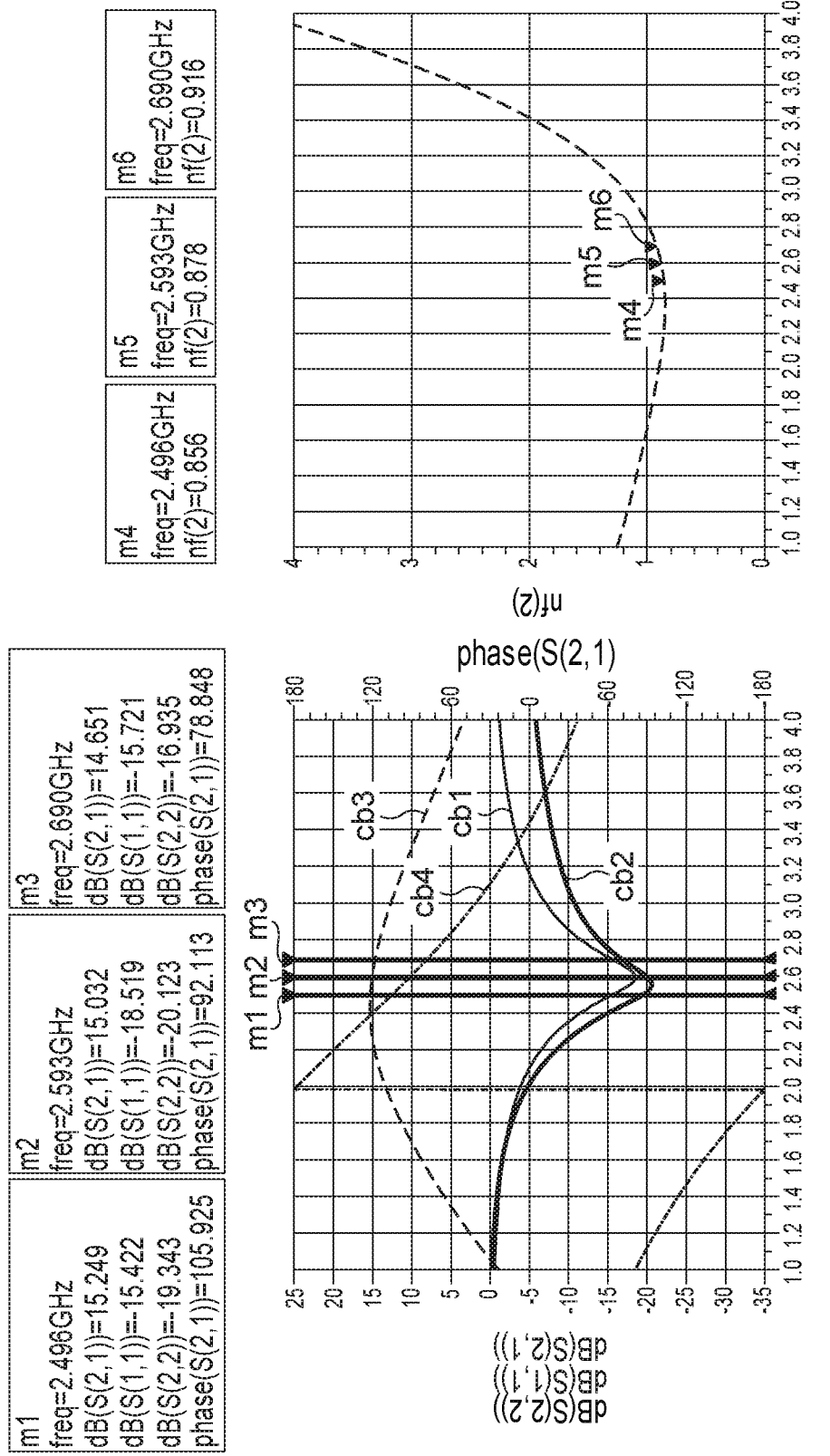
FIG. 24A is a figure showing S-parameters of the LNA of FIG. 21 in the G1-mode.
FIG. 24B is a figure showing noise figure NF of the LNA of FIG. 21 in the G1-mode.

FIG. 21 is a circuit diagram configured by adding a non-linearity compensation circuit 17 of the same circuit configuration as that of FIG. 11 to the LNA 1 of FIG. 20. The non-linearity compensation circuit 17 of FIG. 21 compensates for non-linearity of an output signal to a high-frequency input signal in the G0- to G2-modes. Accordingly, IIP3 becomes higher further in the G0- to G2-modes. The non-linearity compensation circuit 17 in the LNA 1 of FIG. 11 compensates for non-linearity only in the G0- and G1-modes. This is because a compensation effect is not so obtained in the G2-mode. Therefore, the non-linearity compensation circuit 17 of FIG. 21 may also compensate for non-linearity only in the G0- and G1-modes in the same manner as in FIG. 11. Or, conversely, the non-linearity compensation circuit 17 of FIG. 11 may compensate for non-linearity in the G0- to G2-modes.

FIG. 22 is a figure showing the voltage values of the bias voltages VB1 and VB2, and of the gate signals G1, G1R, G01, G23, G23R, G3 and xG3 to be input to the gates of the first to tenth transistor switches SW1 to SW13 of the LNA 1 in FIG. 21 in the respective modes. The truth table of FIG. 22 is made by omitting the signal G01 from FIG. 12.

FIGS. 23A to 26A are figures showing S-parameters of the LNA 1 in FIG. 21 in the G0- to G3-modes, respectively.

FIGS. 23B to 26B are figures showing noise figure NF of the LNA 1 in FIG. 21 in the G0- to G3-modes, respectively.

FIG. 27 is a figure showing a result of simulation for the LNA 1 of FIG. 21 in the G0- to G3-modes. As understood from S21-phase in FIG. 27, the inter-gain mode maximum phase discontinuity [deg] is 12.8, which is larger than that in FIG. 17, however, practically not a problematic value.

Figure 28:
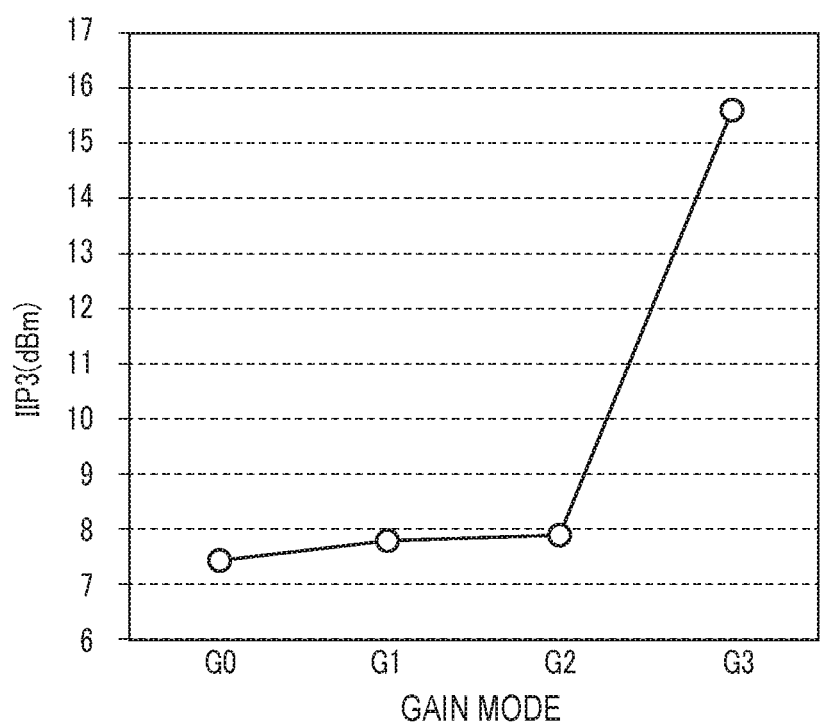
FIG. 28 is a figure graphing IIP3 in the respective gain modes shown in FIG. 27.

FIG. 28 is a figure graphing IIP3 in the respective gain modes shown in FIG. 27. In FIG. 28, the abscissa is gain mode and the ordinate is IIP3 [dBm]. The IIP3 in the G3-mode is 15.6 dBm which is lower than 20.3 dBm shown in FIG. 17. It is, however, noted that FIG. 27 shows a smaller bias current Idd_Ina. In other words, in the third embodiment, satisfactory IIP3 can be obtained even though the bias current Idd_Ina is small.

As described above, in the third embodiment, by connecting the fifth resistor Rt in parallel to the externally-attached inductor Lext in the G3-mode, satisfactory IIP3 can be obtained to a small current Idd_Ina.

Fourth Embodiment

A fourth embodiment is provided with a circuit (hereinafter, referred to as a first IIP3 improving circuitry) that selects whether to connect a series circuit of a resistor and a capacitor between the gate of the first transistor Q1 and the ground node.

Figure 29:
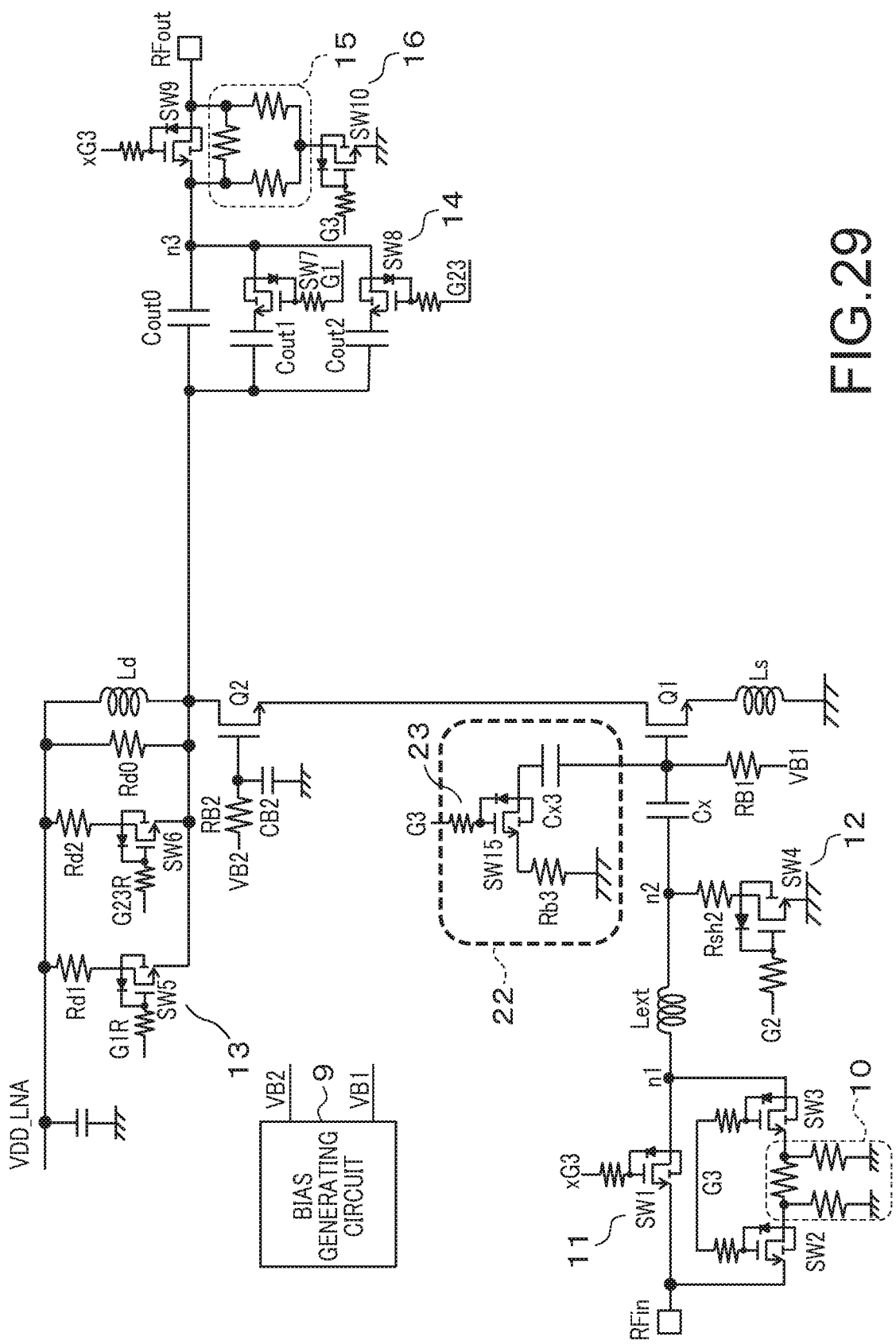
FIG. 29 is a circuit diagram of an LNA according to a fourth embodiment.

FIG. 29 is a circuit diagram of an LNA 1 according to the fourth embodiment. The LNA 1 of FIG. 29 has a circuit configuration made by adding a first IIP3 improving circuitry 22 to the LNA 1 of FIG. 2. The first IIP3 improving circuitry 22 has an eighth switch 23 that selects whether to connect a series circuit of a fifth capacitor Cx3 and a sixth resistor Rb3 connected in series between the gate of the first transistor Q1 and the ground node.

The eighth switch 23 is a fifteenth transistor switch SW15 that turns on when a signal G3 is high. When the fifteenth transistor switch SW15 turns on, the fifth capacitor Cx3 and the sixth resistor Rb3 are connected in series between the gate of the first transistor Q1 and the ground node.

By optimizing the capacitance of the fifth capacitor Cx3 and the resistance value of the sixth resistor Rb3 of the first IIP3 improving circuitry 22 in the G3-mode, IIP3 can be raised further.

Figure 30:
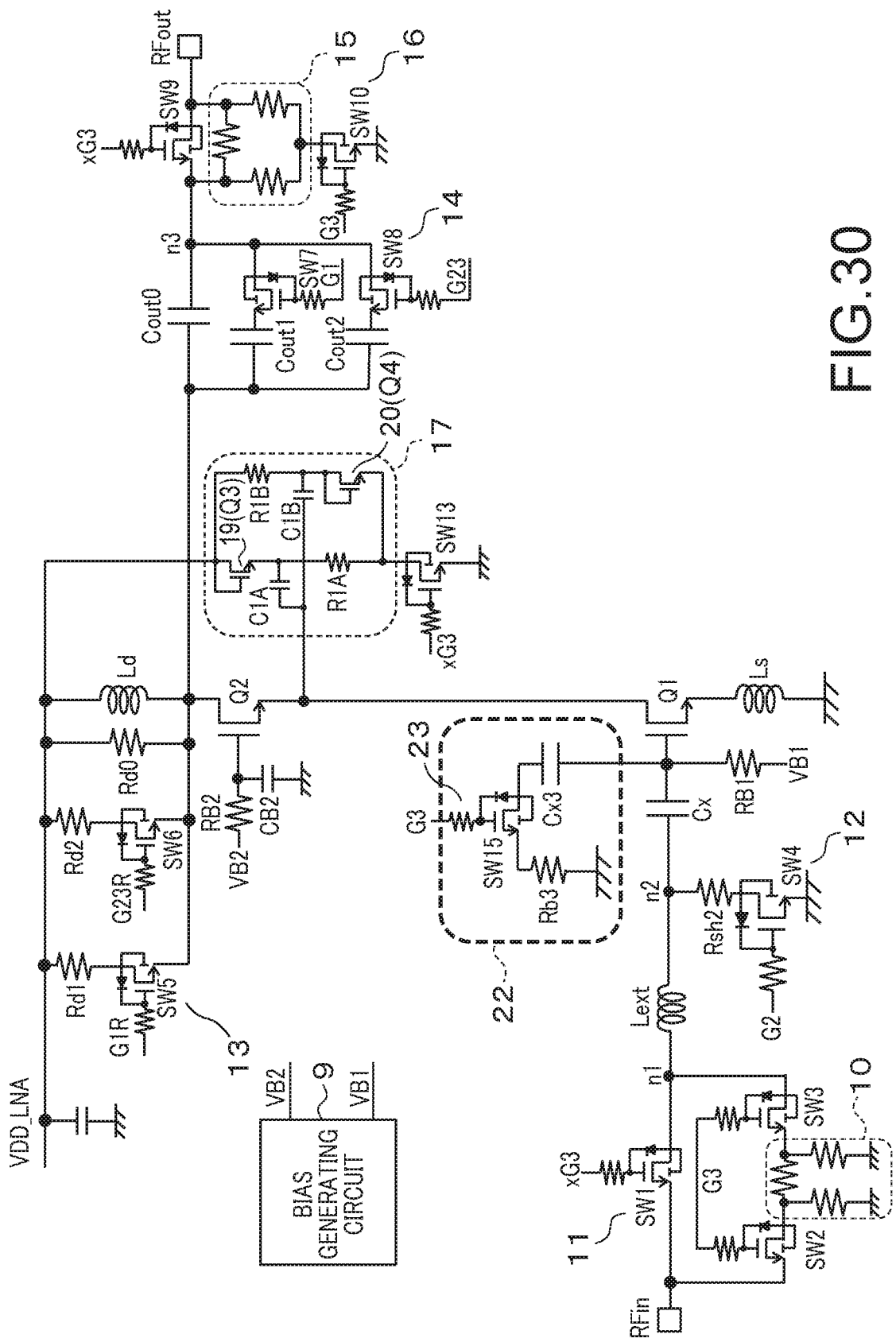
FIG. 30 is a circuit diagram of an LNA configured by adding a non-linearity compensation circuit of the same circuit configuration as that of FIG. 11 to the LNA of FIG. 29.

FIG. 30 is a circuit diagram of an LNA 1 configured by adding a non-linearity compensation circuit 17 of the same circuit configuration as that of FIG. 11 to the LNA 1 of FIG. 29. The non-linearity compensation circuit 17 of FIG. 30 compensates for non-linearity of the output signal in the G0- to G2-modes.

As described above, in the LNA 1 of FIG. 29, the non-linearity compensation circuit 17 can raise further IIP3 in the G0- to G2-modes, and the first IIP3 improving circuitry 22 can raise IIP3 further in the G3-mode.

FIG. 31 is a figure showing the voltage values of the bias voltages VB1 and VB2, and of the gate signals G1, G1R, G23, G23R, G3 and xG3 to be input to the gates of the first to tenth transistor switches SW1 to SW15 of the LNA 1 in FIG. 30 in the respective modes. The voltage value of each gate signal in each gain mode of FIG. 31 is the same as that of FIG. 22.

FIGS. 32A to 35A are figures showing S-parameters of the LNA 1 in FIG. 30 in the G0- to G3-modes, respectively.

FIGS. 32B to 35B are figures showing noise figure NF of the LNA 1 in FIG. 30 in the G0- to G3-modes, respectively.

FIG. 36 is a figure showing a result of simulation for the LNA 1 of FIG. 30 in the G0- to G3-modes. As understood from S21-phase in FIG. 36, the inter-gain mode maximum phase discontinuity [deg] is 10.44, which is larger than that in FIG. 17, however, practically not a problematic value.

Figure 37:
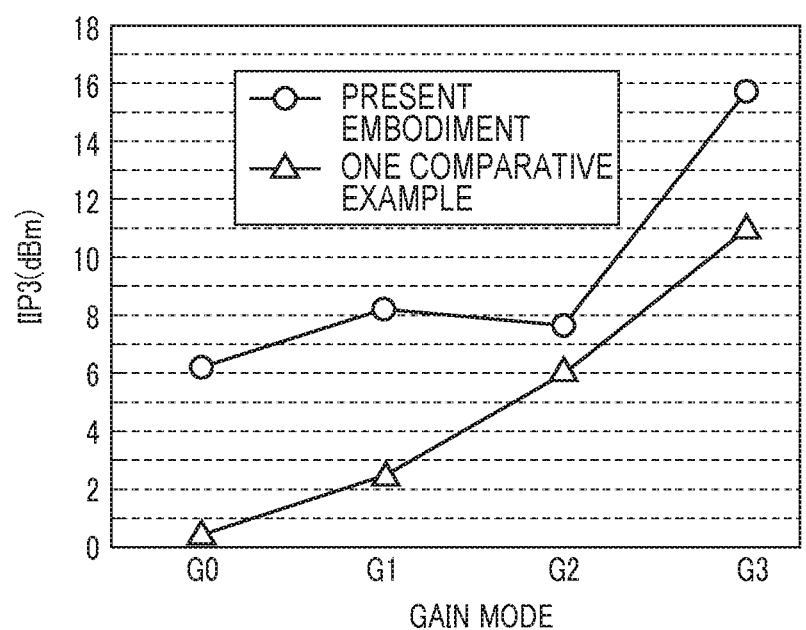
FIG. 37 is a figure graphing IIP3 in the respective gain modes shown in FIG. 36.

FIG. 37 is a figure graphing IIP3 in the respective gain modes shown in FIG. 36. In FIG. 37, the abscissa is gain mode and the ordinate is IIP3 [dBm]. In FIG. 37, a solid line with circular marks indicates IIP3 of the LNA 1 in FIG. 30 in each gain mode and a solid line with triangular marks indicates IIP3 of an LNA 1 in one modification example configured by removing the non-linearity compensation circuit 17 and the first IIP3 improving circuitry 22 from the LNA 1 of FIG. 30. As shown, it is found that, by providing the non-linearity compensation circuit 17 and the first IIP3 improving circuitry 22, IIP3 can be raised further in each gain mode.

As described above, in the fourth embodiment, since the fifth capacitor Cx3 and the sixth resistor Rb3 are connected in series between the gate of the first transistor Q1 and the ground node in the G3-mode, IIP3 in the G3-mode can be raised further.

Fifth Embodiment

A fifth embodiment raises IIP3 in the G3-mode further by using an ESD (Electro-Static Discharge) protection circuitry connected to the gate of the first transistor Q1.

Figure 38:
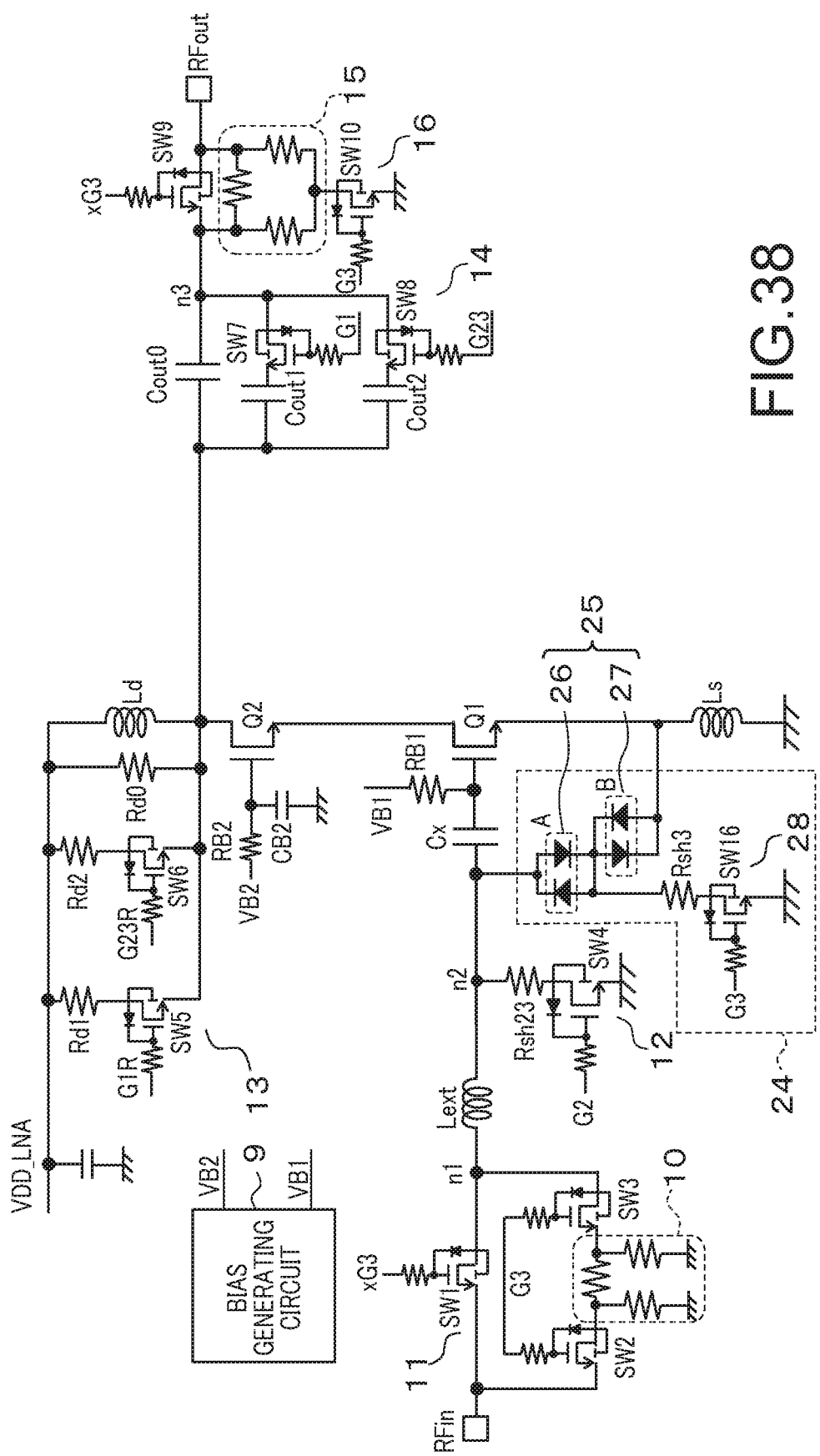
FIG. 38 is a circuit diagram of an LNA according to a fifth embodiment.

FIG. 38 is a circuit diagram of an LNA 1 according to the fifth embodiment. The LNA 1 of FIG. 38 has a circuit configuration made by adding a second IIP3 improving circuitry 24 to the LNA 1 of FIG. 2. An ESD protection circuitry 25 may be connected between the input signal path, which is connected to the gate of the first transistor Q1, and the source of the first transistor Q1. The second IIP3 improving circuitry 24 utilizes the ESD protection circuit 25 for the purpose of improving IIP3 in the G3-mode.

The ESD protection circuitry 25 has a first diode pair 26 having anodes and cathodes connected in parallel in a reverse direction and a second diode pair 27 having anodes and cathodes connected in parallel also in a reverse direction. The first diode pair 26 and the second diode pair 27 are connected in series between the input signal path, which is connected to the gate of the first transistor Q1, and the source of the first transistor Q1. In detail, one end of the first diode pair 26 is connected to the node n2 and the other end of the first diode pair 26 is connected to an end of the second diode pair 27, and the other end of the second diode pair 27 is connected to the source of the first transistor Q1. Since the first diode pair 26 has a larger junction area than the second diode pair 27, the first diode pair 26 functions as a capacitor equivalently.

Moreover, a ninth switch 28, which selects whether the second IIP3 improving circuitry 24 improves IIP3, is connected between the other end of the first diode pair 26 and the ground node.

The ninth switch 28 has a sixteenth transistor switch SW16 that becomes high in the G3-mode. When the sixteenth transistor switch SW16 becomes high, a seventh resistor Rsh3 is connected between the other end of the first diode pair 26 and the ground node. In the G0- to G2-modes, the seventh resistor Rsh3 is cut off. Therefore, in the G0- to G2-modes, the first diode pair 26 and the second diode pair 27 merely function as the ESD protection circuitry 25.

The first diode pair 26 is a high impedance circuit to function as a capacitor equivalently. Therefore, when the sixteenth transistor switch SW16 in the ninth switch 28 is on, a circuit of the capacitor and the seventh resistor Rsh3 connected in series is provided between the gate of the first transistor Q1 and the ground node. Accordingly, IIP3 can be raised further in the same manner as the first IIP3 improving circuitry 22 of FIG. 29.

Figure 39:
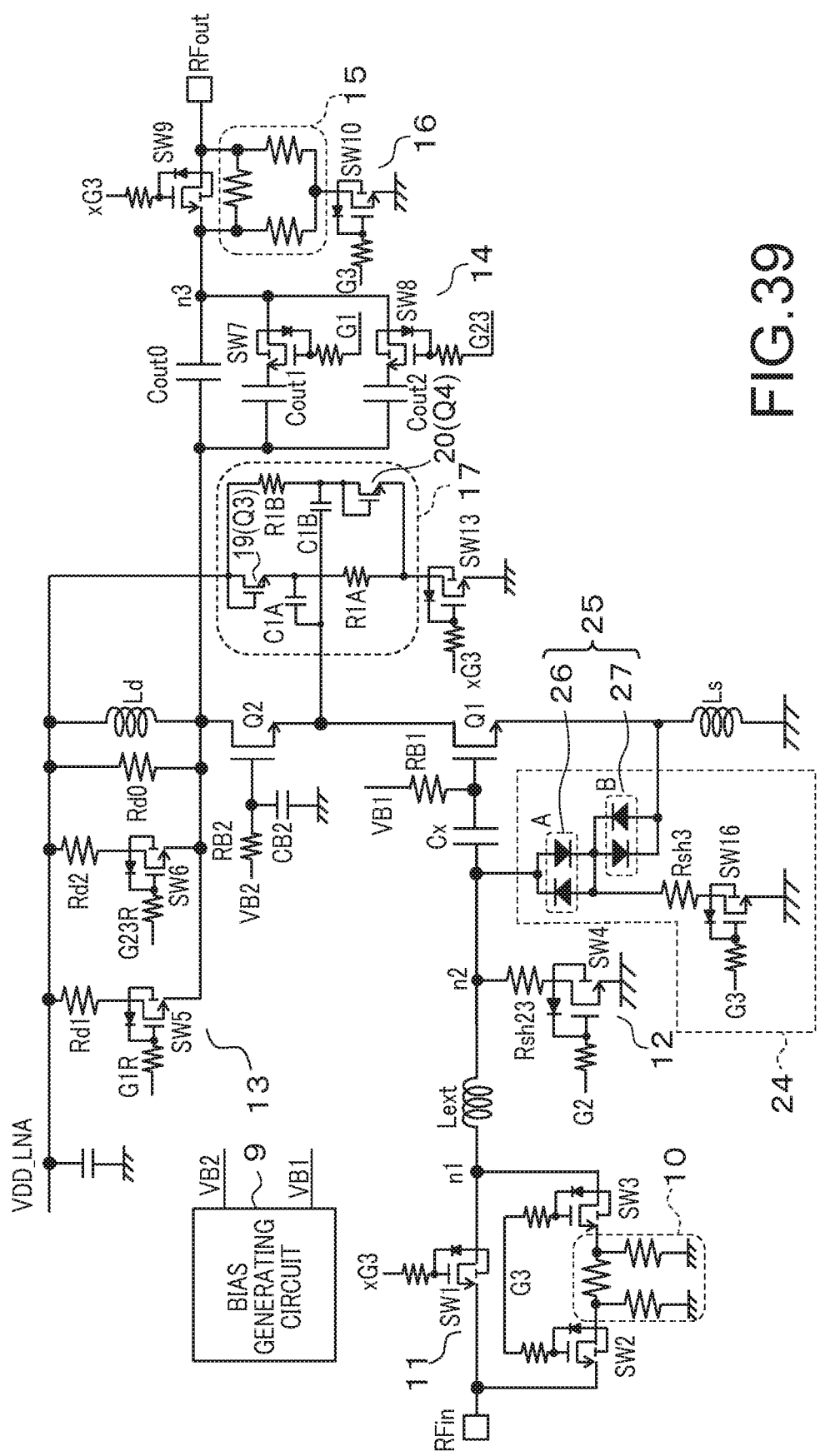
FIG. 39 is a circuit diagram of an LNA configured by connecting a non-linearity compensation circuit having the same circuit configuration as that of FIG. 11 to the LNA 1 of FIG. 38.
Figure 41:
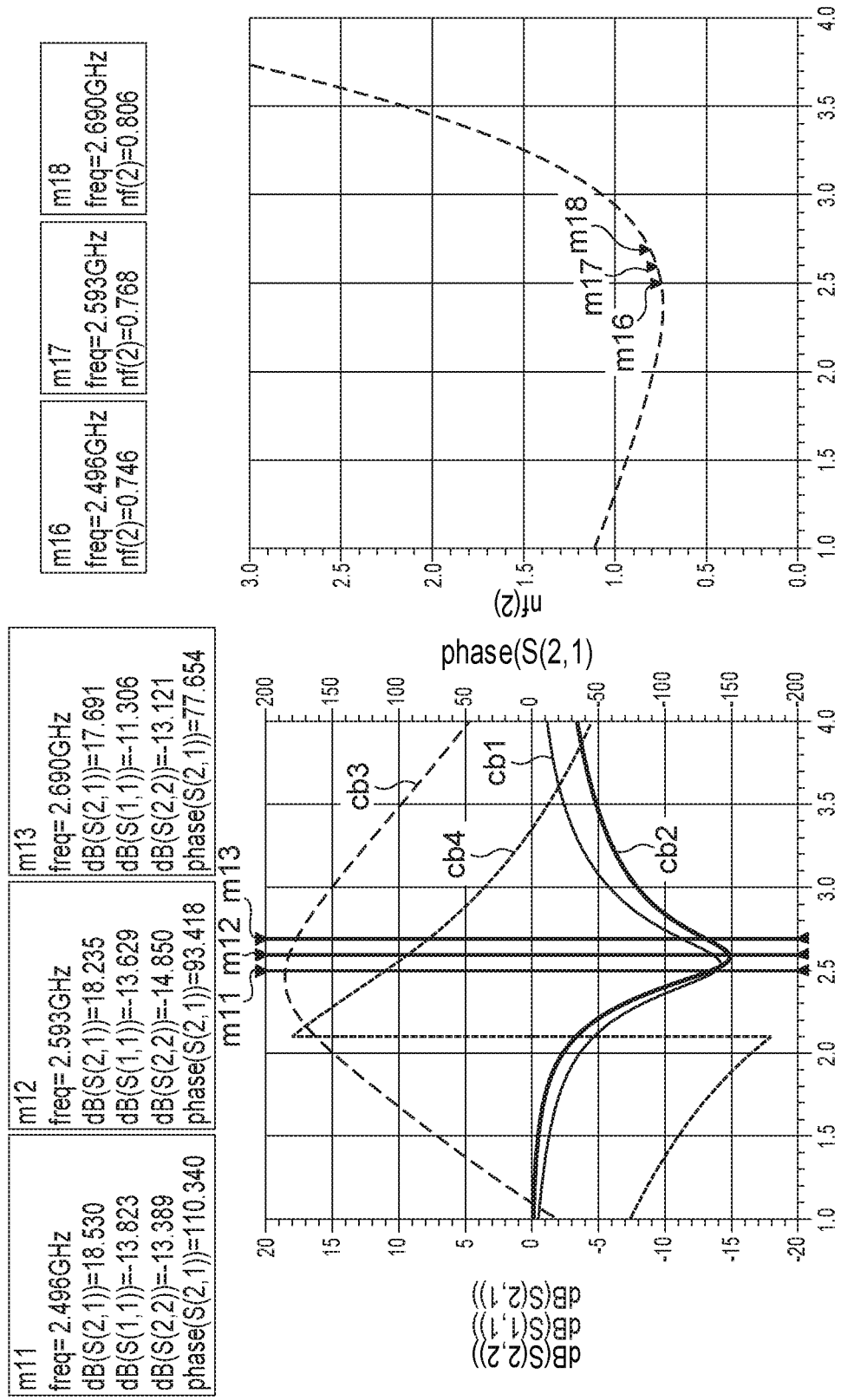
FIG. 41A is a figure showing S-parameters of the LNA of FIG. 40 in the G0-mode.
FIG. 41B is a figure showing noise figure NF of the LNA of FIG. 30 in the G0-mode.
Figure 42:
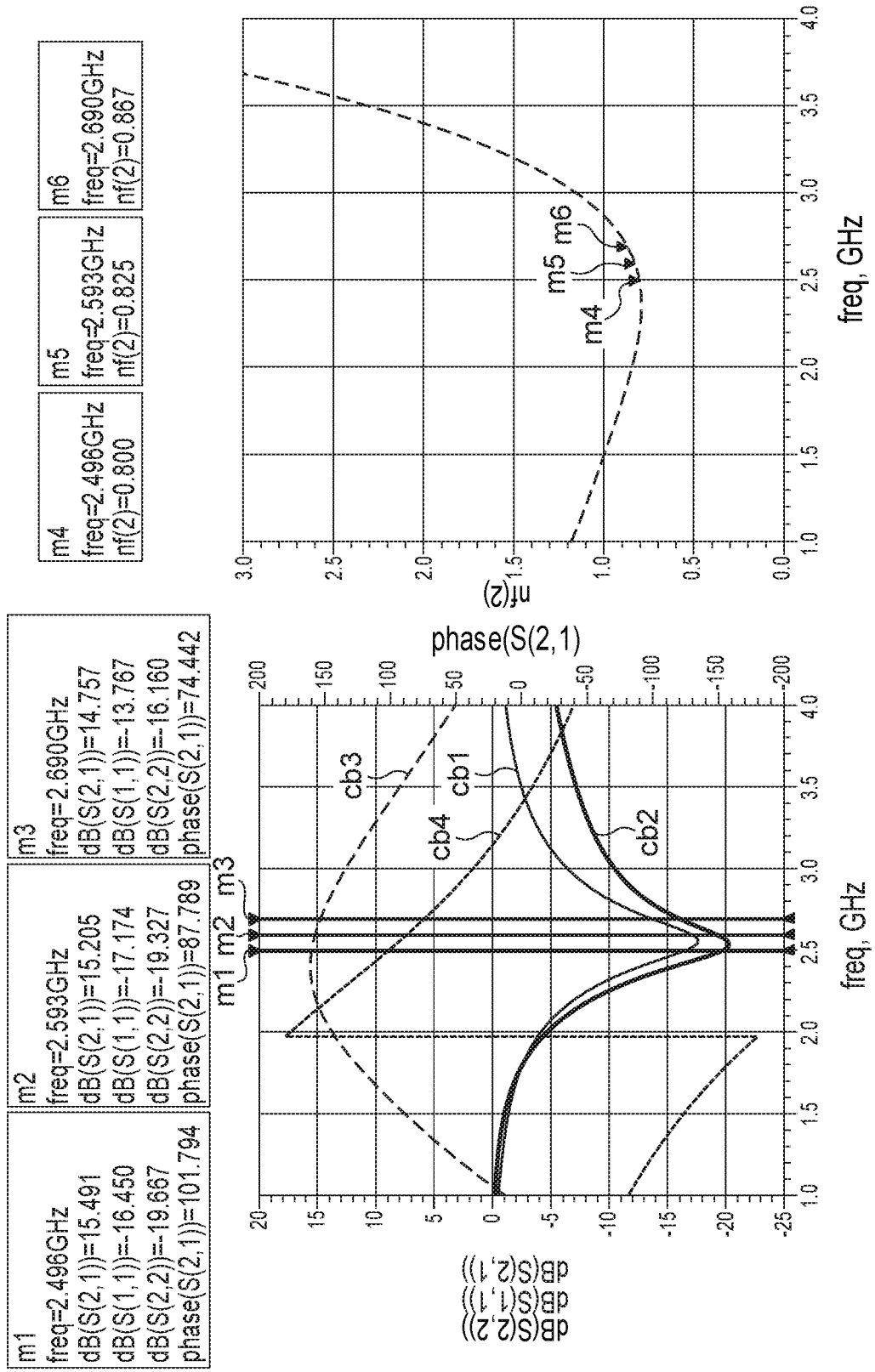
FIG. 42A is a figure showing S-parameters of the LNA of FIG. 30 in the G1-mode.
FIG. 42B is a figure showing noise figure NF of the LNA of FIG. 30 in the G1-mode.
Figure 43:
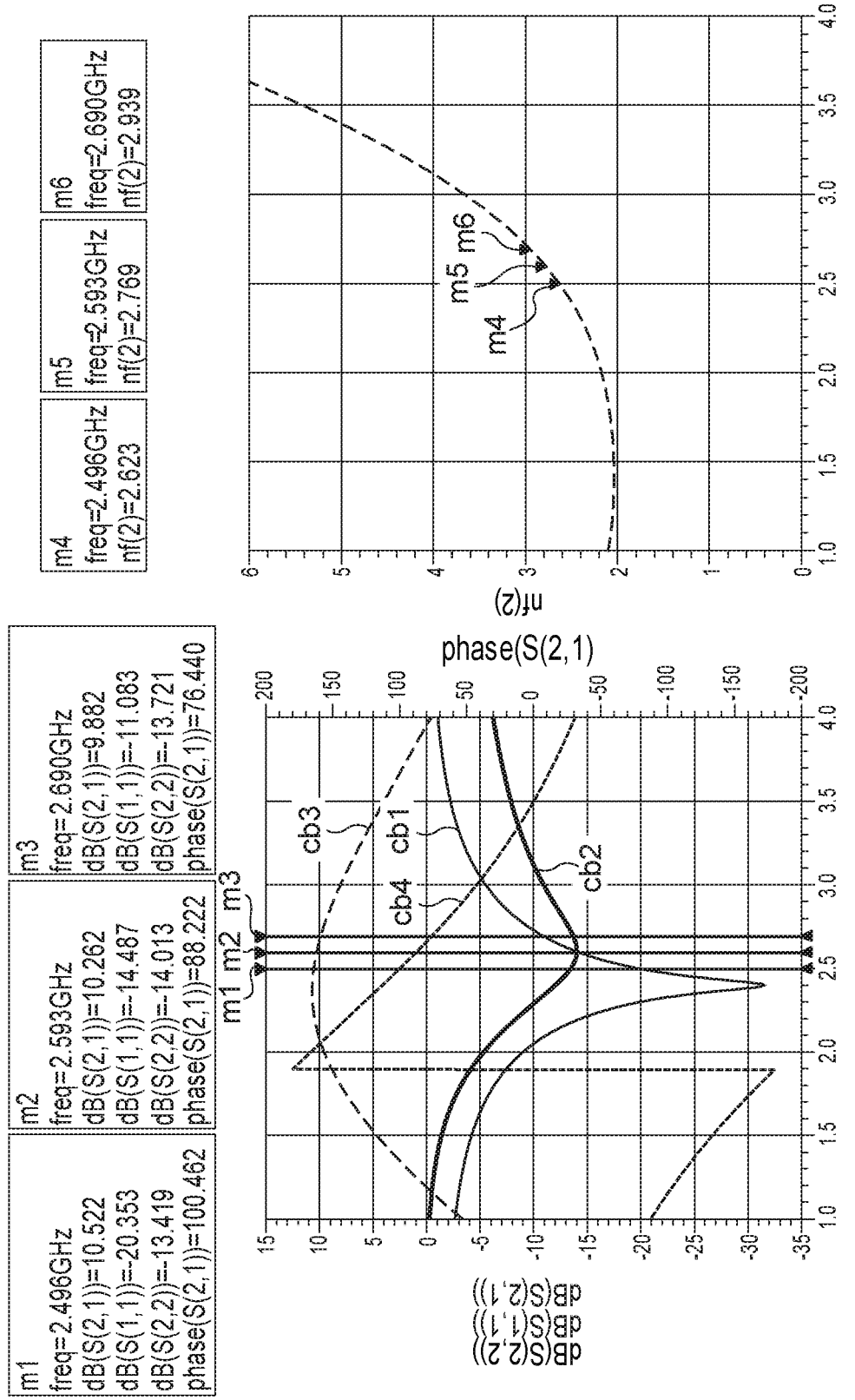
FIG. 43A is a figure showing S-parameters of the LNA of FIG. 30 in the G2-mode.
FIG. 43B is a figure showing noise figure NF of the LNA of FIG. 30 in the G2-mode.
Figure 44:
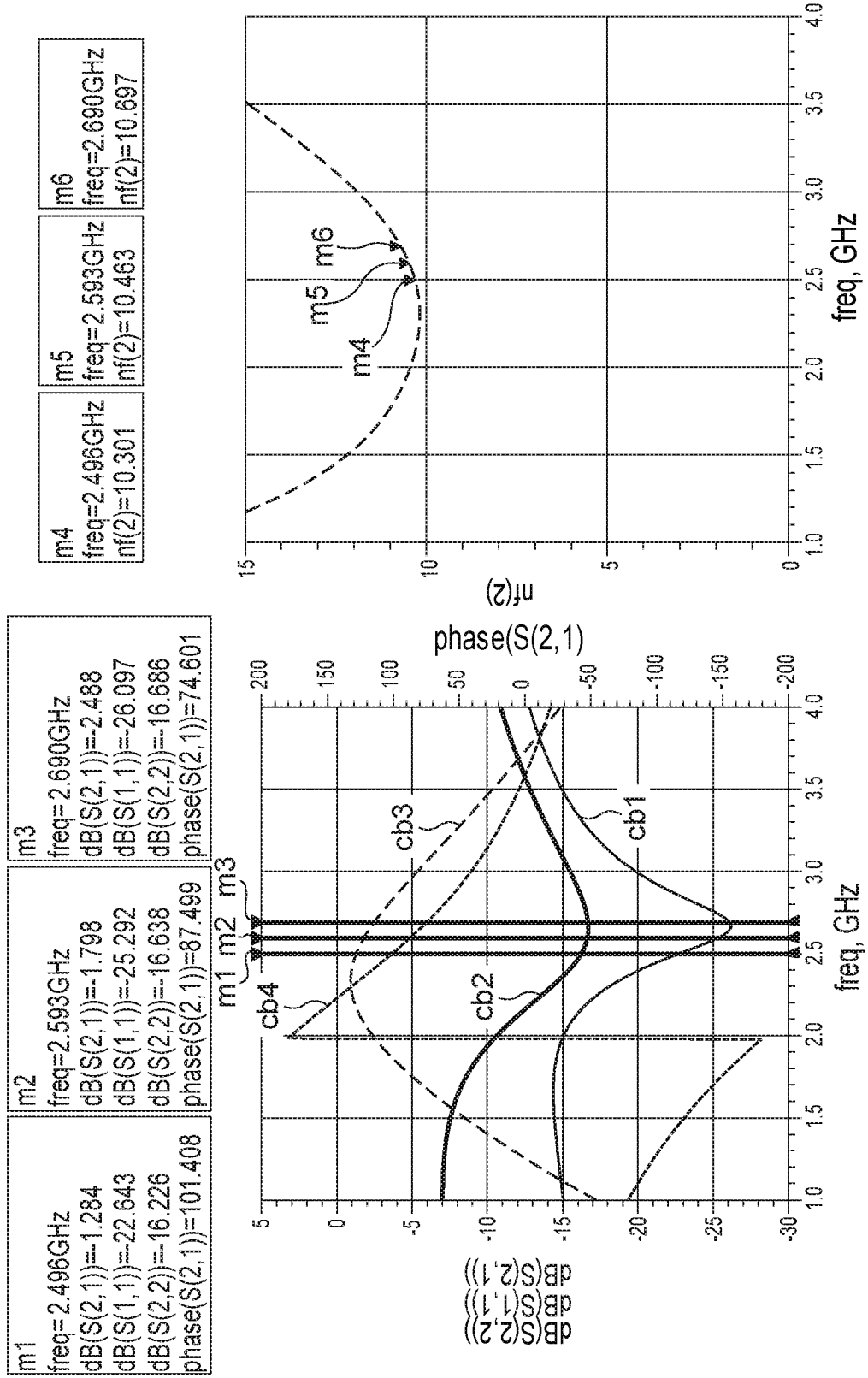
FIG. 44A is a figure showing S-parameters of the LNA of FIG. 30 in the G3-mode.
FIG. 44B is a figure showing noise figure NF of the LNA of FIG. 30 in the G3-mode.

FIG. 39 is a circuit diagram of an LNA 1 configured by connecting a non-linearity compensation circuit 17 having the same circuit configuration as that of FIG. 11 to the LNA 1 of FIG. 38. The non-linearity compensation circuit 17 of FIG. 39 compensates for non-linearity of the output signal in the G0- to G2-modes.

As described above, in the LNA 1 of FIG. 39, the non-linearity compensation circuit 17 can raise IIP3 in the G0- to G2-modes further and the second IIP3 improving circuitry 24 can raise IIP3 in the G3-mode further.

FIG. 40 is a figure showing the voltage values of the bias voltages VB1 and VB2, and of the gate signals G1, G1R, G23, G23R, G3 and xG3 to be input to the gates of the first to tenth transistor switches SW1 to SW16 of the LNA 1 in FIG. 39 in the respective modes. The voltage value of each gate signal in each gain mode is the same as that of FIG. 22.

FIGS. 41A to 44A are figures showing S-parameters of the LNA 1 in FIG. 39 in the G0- to G3-modes, respectively. FIGS. 41B to 44B are figures showing noise figure NF of the LNA 1 in FIG. 39 in the G0- to G3-modes, respectively.

FIG. 45 is a figure showing a result of simulation for the LNA 1 of FIG. 39 in the G0- to G3-modes. As understood from S21-phase in FIG. 45, the inter-gain mode maximum phase discontinuity [deg] is 9. 88 which is sufficiently small.

Figure 46:
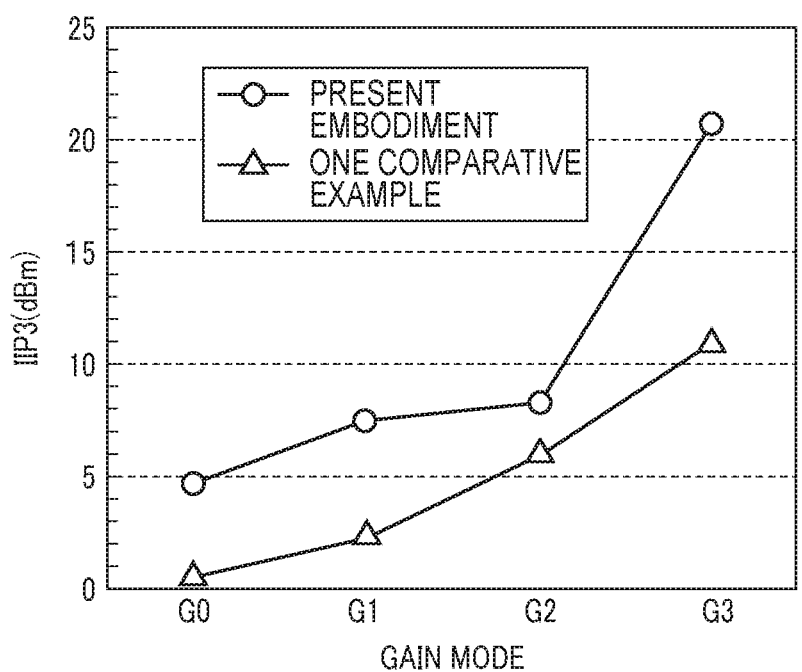
FIG. 46 is a figure graphing IIP3 in the respective gain modes shown in FIG. 45.

FIG. 46 is a figure graphing IIP3 in the respective gain modes shown in FIG. 45. In FIG. 46, the abscissa is gain mode and the ordinate is IIP3 [dBm]. In FIG. 46, a solid line with circular marks indicates IIP3 of the LNA 1 in FIG. 39 in each gain mode and a solid line with triangular marks indicates IIP3 of an LNA 1 in one modification example configured by removing the non-linearity compensation circuit 17 and the second IIP3 improving circuitry 24 from the LNA 1 of FIG. 39. As shown, it is found that, by providing the non-linearity compensation circuit 17 and the second IIP3 improving circuitry 24, IIP3 can be raised further in each gain mode.

As described above, in the fifth embodiment, since the second IIP3 improving circuitry 24 is configured by using the general ESD protection circuitry 25 connected to the gate of the first transistor Q1, IIP3 in the G3-mode can be raised further, without increasing circuit scale so much.

Sixth Embodiment

Figure 47:
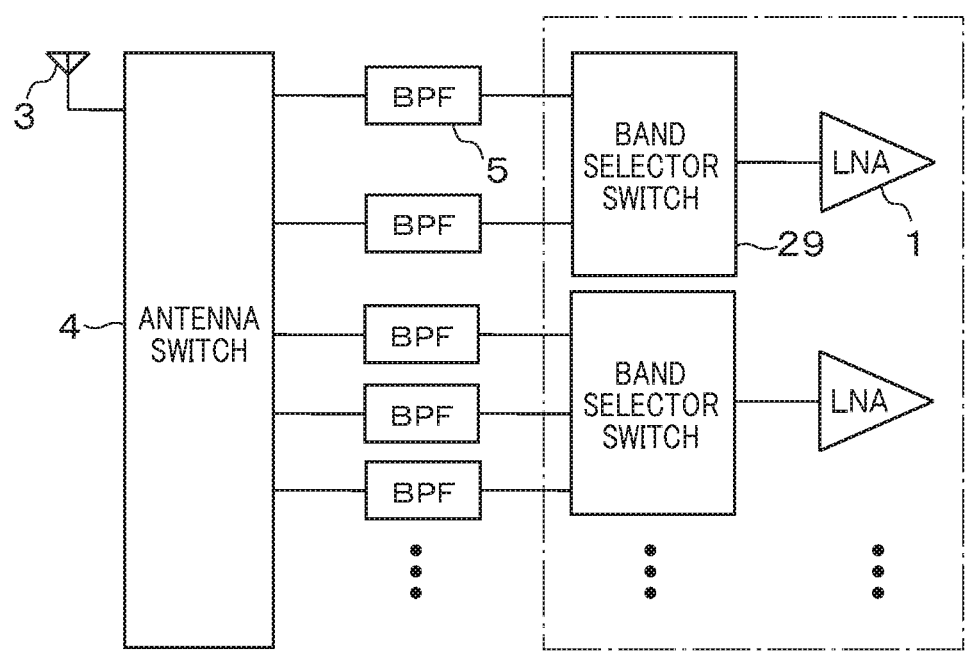
FIG. 47 is a block diagram schematically showing the configuration of a wireless device conforming to carrier aggregation.

Recent mobile communication equipment often performs wireless communication using a carrier aggregation technique for wireless communication utilizing a plurality of bands. In this case, it is required to arrange a plurality of LNAs 1 and a plurality of band selector switches on an SOI substrate. FIG. 47 is a block diagram schematically showing the configuration of a wireless device 2 conforming to carrier aggregation. FIG. 47 shows a block diagram of a reception circuit for signal reception from an antenna 3. The block diagram of a transmission circuit is the same as that of FIG. 1.

The wireless device 2 of FIG. 47 is provided with an antenna switch 4, a plurality of band-pass filters 5, a plurality of band selector switches 29, and a plurality of LNAs 1. The plurality of band selector switches 29 and the plurality of LNAs 1 are arranged on the same SOI substrate, which can be formed into one chip, or may be arranged on the same SOI substrate together with the antenna switch 4 to be formed into one chip.

The plurality of LNAs 1 of FIG. 47 each are the LNA 1 according to any one of the first to fifth embodiments. A reception signal at each frequency switched by the antenna switch 4 is, after passing through the corresponding band-pass filter 5, input to the corresponding band selector switch 29. An input signal selected by the band selector switch 29 is input to the corresponding LNA 1 to be amplified in a gain mode in any one of the G0- to G3-modes.

By arranging the plurality of band selector switches 29 and the plurality of LNAs 1 on the SOI substrate, compactness and low power consumption are possible.

Although, in the above-described first to sixth embodiments, the examples of arrangement of LNA 1 on the SOI substrate are explained, the LNA 1 according to the above-described first to sixth embodiments may be disposed on a bulk silicon substrate. Even in the LNA 1 disposed on the bulk silicon substrate, by providing the above-described non-linear compensation circuit 17, shunt resistors, IIP3 improving circuitry, etc., it is possible to raise IIP3 further.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. High-frequency amplifier circuitry comprising:
 a common-source first transistor to amplify a high-frequency input signal;
 a common-gate second transistor to amplify further a signal amplified by the first transistor to generate an output signal;
 a first inductor connected between a source of the first transistor and a first reference potential node;
 a second inductor connected between a drain of the second transistor and a second reference potential;
 a first switch to select whether to connect a first attenuator on an input signal path from a node receiving the high-frequency input signal to a gate of the first transistor;

a second switch to select whether to connect a first resistor between the input signal path and the first reference potential node;
a third switch to select at least one of a plurality of second resistors connected in parallel to the second inductor; and
a fourth switch to select at least one of a plurality of first capacitors connected in parallel on an output signal path connected to the drain of the second transistor.

2. The high-frequency amplifier circuitry of claim 1, wherein the first switch, the second switch, the third switch, and the fourth switch perform switching in accordance with a gain mode selected from among a plurality of gain modes different in gain from one another.

3. The high-frequency amplifier circuitry of claim 1 further comprising a fifth switch to select whether a second attenuator attenuates a signal having passed through a first capacitor selected by the fourth switch,
wherein the first switch, the second switch, the third switch, the fourth switch, and the fifth switch perform switching in accordance with a gain mode selected from among a plurality of gain modes.

4. The high-frequency amplifier circuitry of claim 1 further comprising a second capacitor connected in parallel to the first resistor,
wherein the second switch selects whether to connect parallel circuitry of the first resistor and the second capacitor between the input signal path and the first reference potential node.

5. The high-frequency amplifier circuitry of claim 1 further comprising a sixth switch to select whether to connect non-linearity compensation circuitry to compensate for non-linearity of an output signal output from the output signal path to the high-frequency input signal, between a connection node of the first transistor and the second transistor,
wherein the first switch, the second switch, the third switch, the fourth switch, and the sixth switch perform switching in accordance with a gain mode selected from among a plurality of gain modes.

6. The high-frequency amplifier circuitry of claim 5, wherein the non-linearity compensation circuitry comprises:
first rectifier circuitry and a third resistor connected in series between the second reference potential and the first reference potential;
a fourth resistor and second rectifier circuitry connected in series between the second reference potential and the first reference potential;
a third capacitor connected between the connection node of the first transistor and the second transistor, and a connection node of the first rectifier circuitry and the third resistor; and
a fourth capacitor connected between the connection node of the first transistor and the second transistor, and a connection node of the fourth resistor and the second rectifier circuitry.

7. The high-frequency amplifier circuitry of claim 1, wherein the first switch is connected in series to a third inductor connected on the input signal path.

8. The high-frequency amplifier circuitry of claim 7 further comprising a seventh switch to select whether to connect a fifth resistor in parallel to the third inductor,
wherein the first switch, the second switch, the third switch, the fourth switch, and the seventh switch perform switching in accordance with a gain mode selected from among a plurality of gain modes.

9. The high-frequency amplifier circuitry of claim 1 further comprising an eighth switch to select whether to connect series circuitry of a fifth capacitor and a sixth resistor connected in series between the gate of the first transistor and a fifth reference potential node.

10. The high-frequency amplifier circuitry of claim 9, wherein the eighth switch connects the series circuitry between the gate of the first transistor and the fifth reference potential node when a lowest gain mode is selected from among a plurality of gain modes.

11. The high-frequency amplifier circuitry of claim 1 further comprising:
ESD (Electro-Static Discharge) protection circuitry connected to the input signal path and the source of the first transistor; and
a ninth switch to select whether to connect the ESD protection circuitry and a seventh resistor in series between the input signal path and a sixth reference potential,
wherein the ESD protection circuitry comprises;
a first diode pair connected in parallel in a reverse direction; and
a second diode pair having a smaller junction area than the first diode pair, the second diode pair being connected in parallel in a reverse direction and connected in series to the first diode pair,
wherein the ninth switch selects whether to connect the first diode pair and the seventh resistor in series between the input signal path and the sixth reference potential.

12. The high-frequency amplifier circuitry of claim 11, wherein the ninth switch connects the first diode pair and the seventh resistor in series between the input signal path and the sixth reference potential when a lowest gain mode is selected from among a plurality of gain modes.

13. The high-frequency amplifier circuitry of claim 2, wherein the first switch connects the first attenuator on the input signal path when a gain mode of a lowest gain is selected from among the plurality of gain modes.

14. The high-frequency amplifier circuitry of claim 2, wherein the second switch connects the first resistor between the input signal path and the first reference potential node in gain modes of lower gains including a gain mode of a lowest gain among the plurality of gain modes.

15. The high-frequency amplifier circuitry of claim 2, wherein the third switch selects a second resistor having a larger resistance value in a gain mode of a higher gain among the plurality of gain modes.

16. The high-frequency amplifier circuitry of claim 2, wherein the fourth switch selects a first capacitor having larger capacitance in a gain mode of a lower gain among the plurality of gain modes.

17. The high-frequency amplifier circuitry of claim 1, wherein the second transistor is cascode-connected to the first transistor.

18. High-frequency amplifier circuitry comprising:
a common-source first transistor to amplify a high-frequency input signal;
a common-gate second transistor to amplify further a signal amplified by the first transistor to generate an output signal;
a first inductor connected between a source of the first transistor and a first reference potential node; and
a second inductor connected between a drain of the second transistor and a second reference potential, wherein, in accordance with a gain mode selected from among a plurality of gain modes different in gain from one another, the high-frequency amplifier circuitry performs:

selecting whether to connect a first attenuator on an input signal path from a node receiving the high-frequency input signal to a gate of the first transistor, selecting whether to connect a first resistor between the input signal path and the first reference potential node, selecting at least one of a plurality of second resistors connected in parallel to the second inductor, and selecting at least one of a plurality of first capacitors connected in parallel on an output signal path connected to the drain of the second transistor.

19. The high-frequency amplifier circuitry of claim 1 further comprising an SOI (Silicon On Insulator) substrate on which the first transistor, the second transistor, the first inductor, the second inductor, the first switch, the second switch, the third switch, and the fourth switch are mounted.

20. A semiconductor device comprising:
a plurality of high-frequency amplifier circuitries arranged on an SOI (Silicon On Insulator) substrate; and
a plurality of high frequency switches arranged on the SOI substrate, corresponding to the plurality of high-frequency amplifier circuitries, respectively, the plurality of high frequency switches selecting one of a plurality of high-frequency input signals and supplying the selected one high-frequency input signal to a corresponding high-frequency amplifier circuitry,
wherein at least one of the plurality of high-frequency amplifier circuitries comprises:
a common-source first transistor to adjust a gain of the high-frequency input signal;
a common-gate second transistor to adjust further the gain of the signal adjusted by the first transistor;
a first inductor connected between a source of the first transistor and a first reference potential node;
a second inductor connected between a drain of the second transistor and a second reference potential;
a first switch to select whether to connect a first attenuator on an input signal path from a node receiving the high-frequency input signal to a gate of the first transistor;
a second switch to select whether to connect a first resistor between the input signal path and the first reference potential node;
a third switch to select at least one of a plurality of second resistors connected in parallel to the second inductor; and
a fourth switch to select at least one of a plurality of first capacitors connected in parallel on an output signal path connected to the drain of the second transistor.

* * * * *